(12) United States Patent
Kobayashi et al.

(10) Patent No.: US 10,505,343 B2
(45) Date of Patent: Dec. 10, 2019

(54) OPTICAL TRANSMITTER AND LIGHT INTENSITY MONITORING METHOD

(71) Applicant: NIPPON TELEGRAPH AND TELEPHONE CORPORATION, Tokyo (JP)

(72) Inventors: Wataru Kobayashi, Atsugi (JP); Toshio Ito, Atsugi (JP); Naoki Fujiwara, Atsugi (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 0 days.

(21) Appl. No.: 16/073,689

(22) PCT Filed: Feb. 2, 2017

(86) PCT No.: PCT/JP2017/003827
§ 371 (c)(1),
(2) Date: Jul. 27, 2018

(87) PCT Pub. No.: WO2017/135381
PCT Pub. Date: Aug. 10, 2017

(65) Prior Publication Data
US 2019/0036293 A1  Jan. 31, 2019

(30) Foreign Application Priority Data
Feb. 4, 2016  (JP) .................. 2016-019979

(51) Int. Cl.
*H01S 5/026*  (2006.01)
*H01S 5/0683*  (2006.01)
(Continued)

(52) U.S. Cl.
CPC .............. *H01S 5/026* (2013.01); *G02F 1/025* (2013.01); *H01S 5/0264* (2013.01);
(Continued)

(58) Field of Classification Search
CPC ........ H01S 5/06; H01S 5/0601; H01S 5/0625; H01S 5/06258; H01S 5/026;
(Continued)

(56) References Cited

U.S. PATENT DOCUMENTS

2003/0095737 A1* 5/2003 Welch .................... B82Y 20/00
385/14
2005/0013332 A1 1/2005 Kish, Jr. et al.
(Continued)

FOREIGN PATENT DOCUMENTS

JP    H09-64334 A    3/1997
JP    2005-72579 A   3/2005
(Continued)

OTHER PUBLICATIONS

Takeshi Fujisawa et al., *A Monolithically Integrated Light Source for Future-Generation 100GbE Transceiver*, technical report of the Institute of Electronics, Information and Communication Engineers, Nov. 2011, OCS2011-68, OPE2011-106, LQE2011-10, pp. 77-80.
(Continued)

*Primary Examiner* — Armando Rodriguez
(74) *Attorney, Agent, or Firm* — Workman Nydegger; Carl T. Reed

(57) ABSTRACT

The present invention provides an optical transmitter and a light intensity monitoring method that provide reliable APC feedback for a semiconductor laser equipped with an SOA. The optical transmitter includes an SOA integrated EA-DFB having a DFB laser, an EA modulator connected to the DFB laser, and an SOA connected to the EA modulator. In the structure of the optical transmitter, a light detector part is disposed forward of the output end side of an SOA part. The light detector part changes part of an output light beam from the SOA part into an electric current and detects light, while guiding the remaining part of the output light beam to a
(Continued)

waveguide. With the light detector part disposed forward for the SOA part, it is possible to feed back the output result from the SOA part. Hence, good APC is possible.

9 Claims, 21 Drawing Sheets

(51) Int. Cl.
| | | |
|---|---|---|
| *H01S 5/042* | (2006.01) | |
| *H01S 5/12* | (2006.01) | |
| *H01S 5/40* | (2006.01) | |
| *H01S 5/50* | (2006.01) | |
| *H04B 10/50* | (2013.01) | |
| *G02F 1/025* | (2006.01) | |
| *H01S 5/024* | (2006.01) | |

(52) U.S. Cl.
CPC .......... *H01S 5/0265* (2013.01); *H01S 5/0425* (2013.01); *H01S 5/0683* (2013.01); *H01S 5/12* (2013.01); *H01S 5/40* (2013.01); *H01S 5/4012* (2013.01); *H01S 5/4087* (2013.01); *H01S 5/50* (2013.01); *H04B 10/505* (2013.01); *H01S 5/02415* (2013.01)

(58) Field of Classification Search
CPC .... H01S 5/0264; H01S 5/0265; H01S 5/0425; H01S 5/0683; H01S 5/12; H01S 5/4012; H01S 5/4087; H01S 5/50; H01S 5/02415; H04B 10/505
See application file for complete search history.

(56) References Cited

U.S. PATENT DOCUMENTS

| | | |
|---|---|---|
| 2005/0018721 A1 | 1/2005 | Kish, Jr. et al. |
| 2005/0041280 A1 | 2/2005 | Lee et al. |
| 2005/0100345 A1 | 5/2005 | Welch et al. |

FOREIGN PATENT DOCUMENTS

| | | | |
|---|---|---|---|
| JP | 2007-158204 A | | 6/2007 |
| JP | 2008-064915 A | | 3/2008 |
| JP | 2013-168440 A | | 8/2013 |
| JP | 2013-258336 | * | 12/2013 |
| JP | 2013-258336 A | | 12/2013 |
| JP | 2014-33127 A | | 2/2014 |
| JP | 2016-18894 A | | 2/2016 |

OTHER PUBLICATIONS

International Search Report dated Apr. 18, 2017, issued in PCT Application No. PCT/JP2017/003827.
International Preliminary Report on Patentability dated Aug. 16, 2018, issued in PCT Application No. PCT/JP2017/003827.
Office Action dated Aug. 20, 2019 in corresponding Japanese Patent Application No. 2017-565629.
Office Action dated Oct. 11, 2019 in corresponding Chinese Patent Application No. 201780009502.2.

* cited by examiner

OPTICAL TRANSMITTER AND LIGHT INTENSITY MONITORING METHOD

TECHNICAL FIELD

The present invention relates to an optical transmitter and a light intensity monitoring method, and more specifically relates to an optical transmitter with "an EA modulator integrated DFB laser (Electroabsorption Modulator Integrated Distributed Feedback Laser: EA-DFB laser) in which a semiconductor optical Amplifier (SOA) is integrated" as a light source and to a light intensity monitoring method.

BACKGROUND ART

With the spread of optical communication, the communication speed through a metropolitan optical communication network connecting a relay station has been increasing from 10 Gbit/s to 25 Gbit/s and further to 40 Gbit/s. This metropolitan optical communication network requires transmission across a long distance of 40 to 80 km with a single-mode fiber (SMF) for 10 Gbit/s, for example, and its important issue has been reduction of the size, power consumption, and chirping of optical transmission modules. Meanwhile, the required transmission distance normally decreases in reverse proportion to the square of the bitrate (modulation rate).

Generally, external modulation methods, which involve only small chirping, have been used to perform high-speed and long-distance transmission as above. Among them, electro absorption (EA) modulators utilizing the electro absorption effect have superior characteristics for reduction of the size and power consumption, integratability with semiconductor lasers, and so on. In particular, an integrated semiconductor optical element (EA-DFB laser) including an EA modulation element and a distributed feedback (DFB) laser, which has good single-wavelength characteristics, monolithically integrated on a single semiconductor substrate has been widely used as a light emitting device for high-speed and long-distance transmission. For the signal light wavelength, a 1.5 μm band, within which the propagation loss of the optical fiber is small, or a 1.3 μm band, within which the chirping is small, is mainly used.

Generally, in optical communication, the optical signal is required to be maintained at constant light intensity. In conventional practices, part of the optical signal is split, its light intensity is monitored, and the electric current to be injected into the DFB laser is controlled so as to maintain the monitored light intensity at a constant level. This is referred to as APC (automatic power control).

FIG. 1 illustrates a conventional light intensity monitoring method for performing the APC. In FIG. 1, a DC drive current is applied to a DFB laser part, and a bias voltage and an RF (signal) voltage are applied to an EA modulator part through a bias-T. As a result, a light beam from the DFB laser part is modulated by the EA modulator part and output as a modulated light output. The output light beam is converted into a parallel light beam by a lens 115, converged by a lens 117, and then input into an optical fiber 118.

Here, changes in light intensity can be monitored by a light detector 120 by splitting part of the parallel light beam with a mirror 119. Then, feedback is applied so as to increase the drive current to the DFB laser part if the light intensity drops whereas feedback is applied so as to decrease the drive current to the DFB laser part if the light intensity rises. In this way, the APC is possible.

Meanwhile, in FIG. 1, the mirror 119, serving as a splitter, is provided at a position at which the modulated light output is yet to be input into the optical fiber. Alternatively, part of the modulated light output after being input into the optical fiber can be split by an optical coupler and monitored.

Next, another conventional configuration will be described. As one of the standards for building next-generation ultrahigh-speed networks, 100 Gigabit Ethernet (registered trademark) (100 GbE) is under development (see Non Patent Literature 1). In particular, 100 GBASE-LR4 and 100 GBASE-ER4 are considered promising, which involve data exchange between buildings separated by a middle to long distance (up to 10 km) and between buildings separated by a very long distance (up to 40 km). In the above standard, an LAN-WDM method is used in which 25 Gb/s (or 28 Gb/s) data are set for each of four predetermined optical wavelengths (e.g., four wavelengths of 1294.53 to 1296.59 nm, 1299.02 to 1301.09 nm, 1303.54 to 1305.63 nm, and 1308.09 to 1310.19 nm) and multiplexed to generate a 100 Gb/s signal.

The LAN-WDM uses a wavelength multiplexing optical transmitter module. For the wavelength multiplexing optical transmitter module, it is important to reduce its size, energy consumption, and chirping. An integrated semiconductor optical element (EA-DFB laser) has been widely used which uses an external modulation method, in which the chirping is small, and includes an EA modulation element and a DFB laser monolithically integrated on a single semiconductor substrate.

FIG. 2 illustrates the configuration of a conventional wavelength multiplexing optical transmitter module used in 100 GbE. An optical transmitter module 323 including a wavelength multiplexing optical transmitter, which is a single semiconductor chip 322, as a light source, outputs a multiplexed modulated signal light beam into an optical fiber 321. The semiconductor chip 322 includes four DFB laser parts 301 to 304, four electro absorption (EA) optical modulator parts 305 to 308, and a single multi-mode interference 4×1 optical multiplexer 313. In other words, the semiconductor chip 322 includes four EA-DFBs in which the DFB laser parts 301 to 304 and the EA modulator parts 305 to 308 are connected to each other respectively to thereby integrate the DFB lasers and EA modulator parts. Also, input waveguides 309 to 312 and an output waveguide 314 are connected to the MMI 4×1 optical multiplexer 313.

Each of the DFB laser parts 301 to 304 outputs a continuous light beam, and the laser oscillation wavelength bands of the DFB laser parts 301 to 304 are 1294.53 to 1296.59 nm, 1299.02 to 1301.09 nm, 1303.54 to 1305.63 nm, and 1308.09 to 1310.19 nm, respectively. Note that the above four wavelength bands are usually referred to as lane 0, lane 1, lane 2, and lane 3 from the shortest wavelength side, respectively.

The EA optical modulator parts 305 to 308 include absorption layers of the same composition and, in accordance with inputs being individual RF signals (at 25 Gb/s or 28 Gb/s), convert the continuous light beams from the DFB laser parts 301 to 304 into 25-Gb/s or 28-Gb/s modulated signal light beams. The modulated signal light beams output from the EA optical modulator parts 305 to 308 are output into the waveguides 309 to 312, respectively.

The MMI optical multiplexer 313 multiplexes the four modulated signal light beams, which differ in wavelength, and outputs them as a single bundle of wavelength-multiplexed light beams into the output waveguide 314. The single bundle of wavelength-multiplexed light beams is emitted into a space as a scattered light beam 315, changed into a parallel light beam 317 by a lens 316, passes through an isolator 318, converged into a converged light beam 320 by a second lens 319, and coupled to a fiber 321.

Meanwhile, though not illustrated, besides the above, the optical transmitter module 323 includes a temperature sensor (e.g., thermistor) for the semiconductor chip 322, a Peltier element for temperature control, and DC power sources for supplying power to the DFB laser parts 301 to 304 and the EA optical modulator parts 305 to 308. The optical transmitter module 323 also includes a modulator driver and radio-frequency line termination resistors for driving the EA optical modulator parts 305 to 308, and signal lines and a control circuit for controlling the amplitude, bias voltage, electric cross point of the modulator driver. Further, an electric signal waveform shaping circuit and a clock extraction circuit as well as a circuit that reduces the influence of variation in power supply voltage may be provided before the modulator driver in some cases.

As the EA optical modulator parts 305 to 308, InGaAlAs-based tensile strained quantum wells are used, which have a good extinction ratio and are effective in suppressing pile up of holes. As the output waveguides 309 to 312 and 314, ridge waveguides embedded in benzocyclobutene (BCB), which is low in permittivity, are used in order to ensure radio frequency bands. As the MMI optical multiplexer 313, a high-mesa type waveguide, which enables strong light confinement and small radiation loss, is used.

The size of the semiconductor chip 322 is 2,000×2,600 μm, the cavity length of the four DFB laser parts 301 to 304 is 400 μm, the waveguide length between the DFB laser parts 301 to 304 and the EA modulator parts 305 to 308 is 50 μm, and the element length of the EA optical modulator parts 305 to 308 is 150 μm.

The optical transmitter module 323 is obtained by mounting the fabricated semiconductor chip 322 in a package having an ultra-small size of 12 mm×20 mm, and is capable of 40 km error-free transmission through a single-mode fiber when operated at 100 Gbit/s at 40° C. These results indicate that the optical transmitter module 323 has sufficient performance as a future-generation 100 GbE transceiver.

Meanwhile, in a case of performing APC in a configuration in which modulated light beams with a plurality of wavelengths are multiplexed as in FIG. 2, it is meaningless to split and monitor part of the modulated light beams between the lenses 316 and 319 as in FIG. 1. Specifically, since a plurality of modulated light beams are multiplexed, detecting a decrease of the modulated light beams does not indicate which DFB laser part a feedback should be given to. For this reason, in a device as illustrated in FIG. 2, the monitoring is performed at the back facet side of each DFB laser part.

FIG. 2 denotes light detectors 1 to 4 for monitoring the DFB laser parts, respectively. The light detectors 1 to 4 monitor the intensities of light beams output rearward from the DFB laser parts. This utilizes the nature of a DFB laser in which it generally outputs a laser light beam rearward at the same time as outputting a laser light beam forward, and the intensity of the light beam traveling forward and the intensity of the light beam traveling rearward are not always equal but are correlated such that as one becomes stronger the other becomes stronger and as one becomes weaker the other becomes weaker. Feedback is applied so as to increase the drive current to a DFB laser part if the light intensity detected by the corresponding light detector drops whereas feedback is applied so as to decrease the drive current if the light intensity rises. In this way, APC is possible.

FIG. 3 illustrates a cross-sectional view of a conventional semiconductor chip in which DFB laser parts, EA modulator parts, and optical multiplexer parts are formed. Reference sign 501 denotes an n electrode, reference sign 502 denotes an n-InP substrate, reference sign 503 denotes an n-InP cladding layer, reference sign 504 denotes an active layer of each DFB laser part, and reference sign 505 denotes a guide layer of the DFB laser part. A diffraction grating is formed in the guide layer 505 by EB (electron beam) lithography. Reference sign 506 denotes a p-InP cladding layer, and reference sign 507 denotes an electrode of the DFB laser part. Further, reference sign 508 denotes an absorption layer of each EA modulator part, reference sign 509 denotes an electrode of the EA modulator part, and reference signs 510 and 511 denote a core layer and a non-doped InP layer of the waveguide (or optical multiplexer), respectively.

At a center portion of each DFB laser part, a ¼ wavelength phase shifter 512 is provided which is obtained by shifting the phase of the diffraction grating by ¼ of the wavelength, to implement a single mode with the oscillation wavelength. In the single semiconductor chip, the active layers 504 of the plurality of DFB laser parts have the same composition, and the pitches of the diffraction gratings are changed to change the respective wavelengths. Also, in the single semiconductor chip, the absorption layers 508 of the plurality of EA modulator parts have the same composition as well.

A light detection layer 513 and an upper cladding layer 514 of a waveguide and an electrode 515 are provided rearward of each DFB laser part to form a light detector. Here, the light detection layer 513 and the upper cladding layer 514 of the waveguide may have the same compositions as the absorption layer 508 of the EA modulator part and the p-InP cladding layer 506, respectively. Also, the light detection layer 513 of the waveguide may have the same compositions as the active layer 504 of the DFB laser part and the guide layer 505 of the DFB laser part.

Meanwhile, while the conventional optical transmitter module illustrated in FIG. 1 and the conventional integrated wavelength multiplexing optical transmitter module illustrated in FIG. 2 are useful, the chirping problem still remains. To solve this, the structure of a semiconductor chip with an SOA integrated EA-DFB laser as illustrated in FIG. 4 has been proposed, in which a semiconductor optical amplifier (SOA) is further integrated with the EA-DFB laser (see Patent Literature 1).

Usually, the length of the SOA part is, for example, about 1/6 of the length of the DFB laser part, and the composition of the SOA part is the same as the composition of the DFB laser part. However, there is no diffraction grating in the SOA part. In the SOA integrated EA-DFB laser, in order to avoid increase in the number of control terminals, the DFB laser part and the SOA part are controlled using the same terminal, that is, electric currents are injected into the DFB laser part and the SOA part in accordance with the resistance ratio between the DFB laser part and the SOA part designed to achieve the desired current distribution.

By using the SOA integrated EA-DFB laser with the structure illustrated in FIG. 4, the chirping problem can be solved. Moreover, the output of the modulated light output can be amplified by the SOA part as well.

CITATION LIST

Patent Literature

PTL 1: Japanese Patent Laid-Open No. 2013-258336

Non Patent Literature

NPL 1: Takeshi Fujisawa, Shigeru Kanazawa, Hiroyuki Ishii, Yoshihiro Kawaguchi, Nobuhiro Nunoya, Akira Ohki, Kiyoto Takahata, Ryuzo Iga, Fumiyoshi Kano, Hiromi Oohashi, "A monolithically integrated light source for future-generation 100 GbE transceiver", technical report of the Institute of Electronics, Information and Communication Engineers, October, 2011, OCS2011-68, OPE2011-106, LQE2011-10, pp. 77-80

SUMMARY OF INVENTION

Technical Problems

However, in the case of using the SOA integrated EA-DFB laser illustrated in FIG. 4 in the structure illustrated in FIG. 2, there is a problem that APC does not function properly if the conventional method is used.

FIG. 5 illustrates a configuration obtained by using the above SOA integrated EA-DFB laser in the configuration in FIG. 2. FIG. 5 is a configuration obtained by further adding SOA parts 5 to 8 to the configuration in FIG. 2. Here, the DFB laser part 301 and the SOA part 5, the DFB laser part 302 and the SOA part 6, the DFB laser part 303 and the SOA part 7, and the DFB laser part 304 and the SOA part 8 are each supplied with their drive currents from the same terminal.

FIG. 5 denotes the light detector parts 1 to 4 for monitoring. Each of the light detector parts 1 to 4 monitors the intensity of the light beam output rearward from the corresponding DFB laser part, and control is performed to apply feedback so as to increase the drive currents to the corresponding DFB laser part and SOA part (the DFB laser part and the SOA part are driven through the same terminal) if the light intensity drops whereas applying feedback so as to decrease the drive currents if the light intensity rises.

FIG. 6 illustrates a cross-sectional view of a semiconductor chip with conventional SOA integrated EA-DFB lasers obtained by adding active layers 904, guide layers 905, and electrodes 909 of SOA parts to the structure illustrated in FIG. 3. Here, each active layer 904 and each guide layer 905 have the same compositions as the active layer 504 and the guide layer 505, respectively.

In this structure, the light detector parts 1 to 4 monitor only the DFB lasers, but the feedback is applied to both the DFB laser parts and the SOA parts. Then, if, for example, the SOA parts has deteriorated and the optical gain of the SOA parts has dropped, the light detector parts 1 to 4 cannot detect the corresponding decrease in intensity of the light outputs of the SOA integrated EA-DFB lasers. This leads to a problem that the intensities of the light outputs of the SOA integrated EA-DFB lasers have dropped but corresponding feedback cannot be applied.

Also, even if the conventional light intensity monitoring method illustrated in FIG. 1 is used for the output light beam of each SOA integrated EA-DFB laser, there is a problem that it is impossible to distinguish between deterioration of the DFB laser part and deterioration of the SOA part.

The present invention has been made in view of the above problems, and provides an optical transmitter and a light intensity monitoring method that provide reliable APC feedback for a semiconductor laser equipped with an SOA.

Solution to Problems

To solve the above problems, the present invention provides an optical transmitter including an SOA integrated EA-DFB having a DFB laser, an EA modulator connected to the DFB laser, and an SOA connected to the EA modulator; a first light detector for monitoring a signal light beam emitted from the SOA of the SOA integrated EA-DFB; and a drive device connected to the DFB laser and the SOA by a single control terminal, controlling a drive current in accordance with light intensity detected by the first light detector.

Another aspect of the present invention is that the optical transmitter further includes a second light detector for monitoring a light beam emitted from the DFB laser, the light beam being monitored without passing through the SOA.

Another aspect of the present invention is that the second light detector is disposed to be connected to an end surface of the DFB laser opposite from an end surface thereof connected to the EA modulator.

Another aspect of the present invention is that the second light detector is disposed between the DFB laser and the SOA of the SOA integrated EA-DFB.

Another aspect of the present invention is that the SOA integrated EA-DFB has a plurality of SOA integrated EA-DFBs with different oscillation wavelengths of the respective DFB lasers, and the optical transmitter further includes an optical multiplexer for multiplexing a plurality of signal light beams emitted from the SOAs of the plurality of SOA integrated EA-DFBs and outputs a resultant wavelength-multiplexed light beam.

Another aspect of the present invention provides a light intensity monitoring method in an SOA integrated EA-DFB including a DFB laser, an EA modulator connected to the DFB laser, and an SOA connected to the EA modulator. The method includes the steps of: monitoring a first light intensity with which to monitor a light beam emitted from the SOA; monitoring a second light intensity with which to monitor a light beam emitted from the DFB laser, the light beam being monitored without passing through the SOA; and comparing the first light intensity and the second light intensity.

Advantageous Effects of Invention

The present invention makes it possible to perform APC feedback for a semiconductor laser equipped with an SOA. The present invention also makes it possible to distinguish which one of the semiconductor laser and the SOA has deteriorated.

DESCRIPTION OF EMBODIMENTS

Embodiments of the present invention will be specifically described below.

(Embodiment 1) FIGS. 7A and 7B and FIGS. 8A and 8B illustrate configurations of an optical transmitter according to embodiment 1 of the present invention. Embodiment 1 is a single SOA integrated EA-DFB laser in which a light detector part 404 is disposed forward of the output end side of an SOA part 403. FIGS. 8 A and 8B are cross-sectional views of semiconductor chips 324 in FIGS. 7A and 7B, respectively.

Figure 7A:
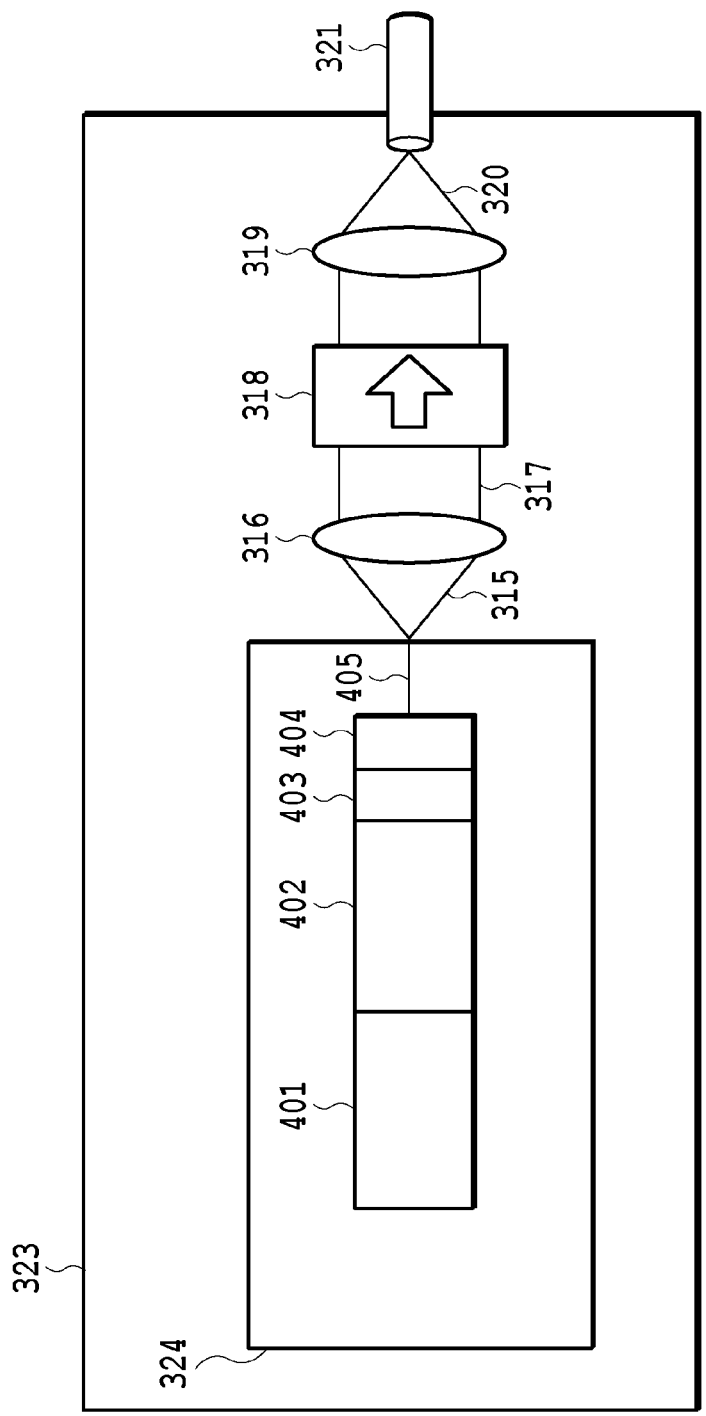
FIG. 7A is a diagram illustrating a configuration of an optical transmitter according to embodiment 1 of the present invention.
Figure 7B:
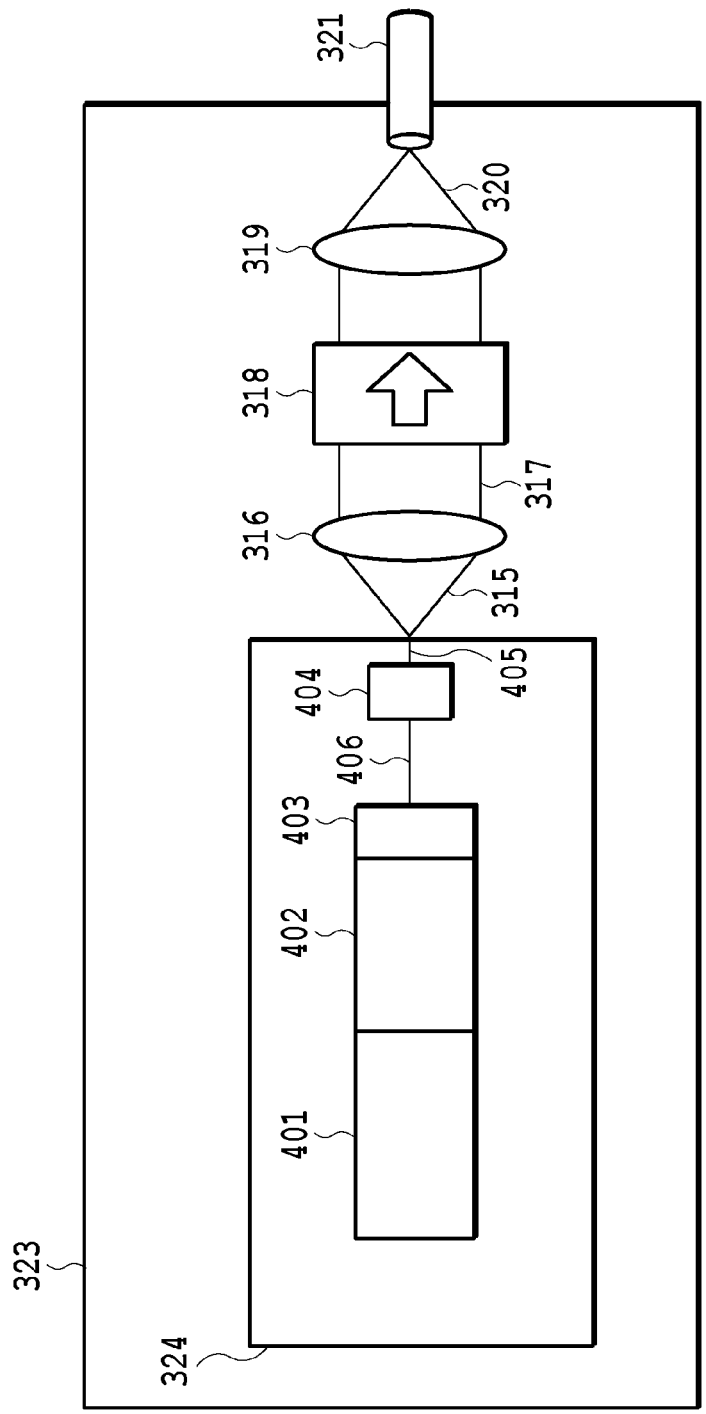
FIG. 7B is a diagram illustrating another configuration of the optical transmitter according to embodiment 1 of the present invention.
Figure 8A:
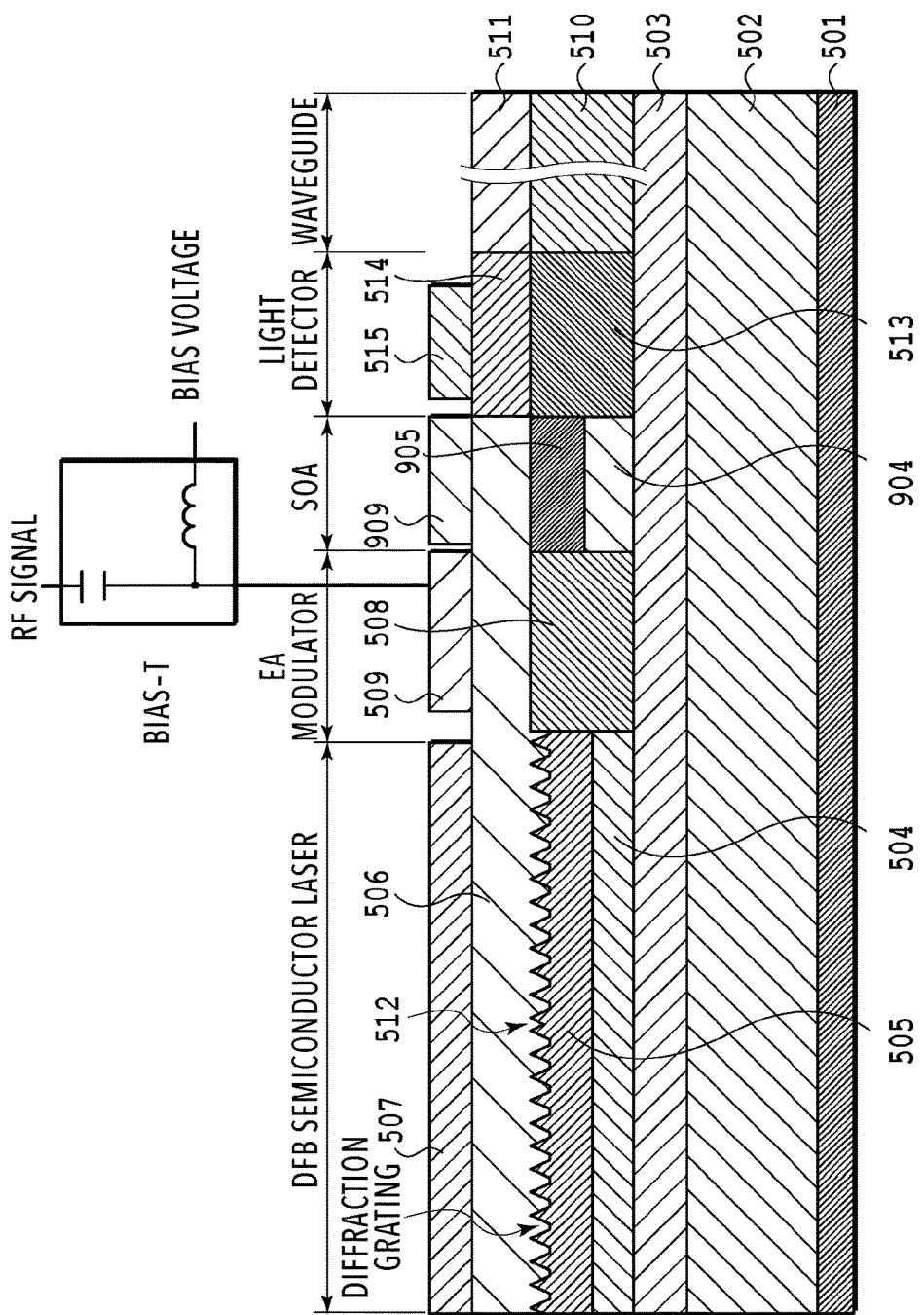
FIG. 8A is a cross-sectional view of a semiconductor chip with the optical transmitter according to embodiment 1 of the present invention illustrated in FIG. 7A.
Figure 8B:
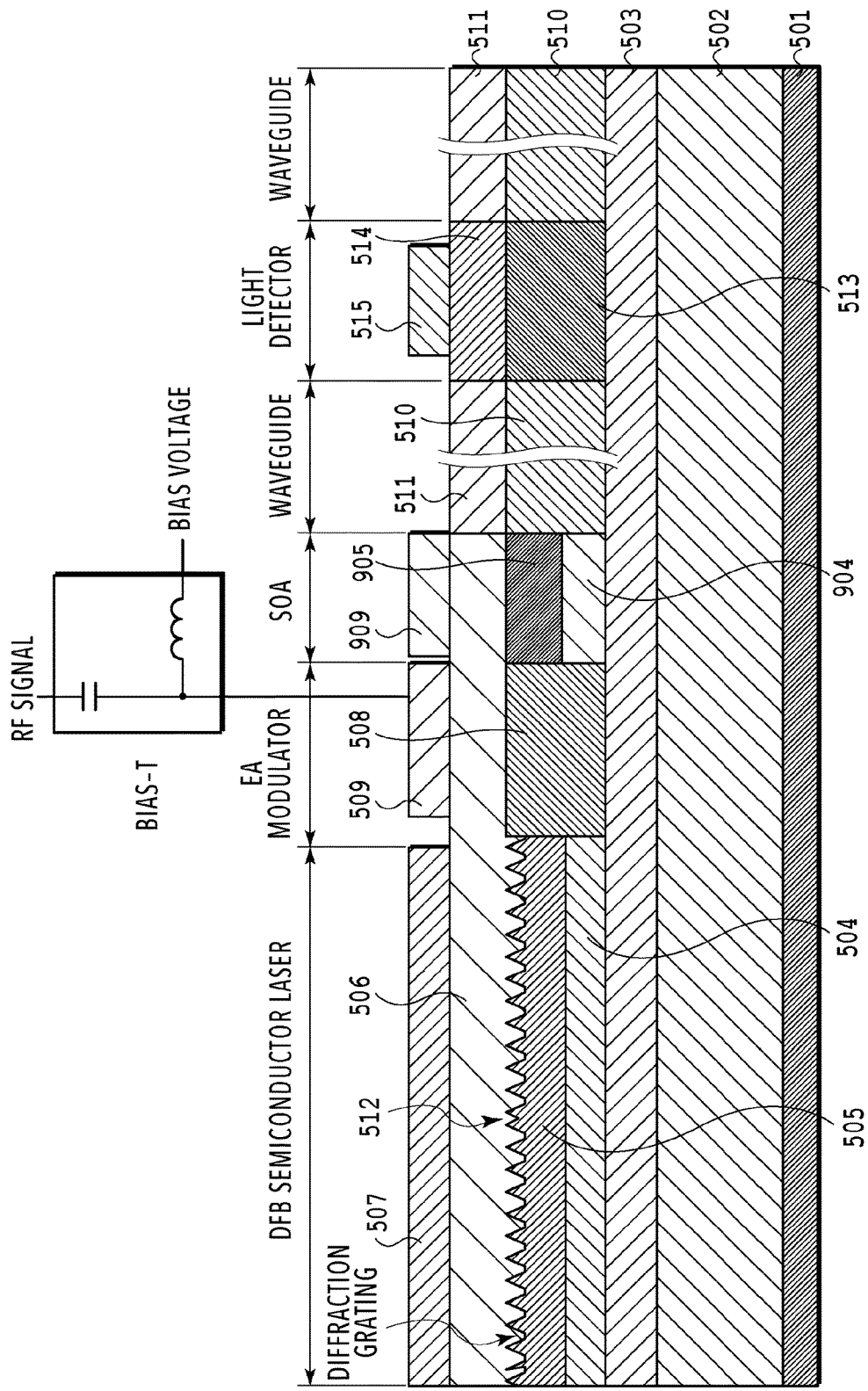
FIG. 8B is a cross-sectional view of a semiconductor chip with the optical transmitter according to embodiment 1 of the present invention illustrated in FIG. 7B.

Note that as illustrated in FIG. 7B and its cross-sectional view FIG. 8B, in this embodiment, the light detector part 404 does not have to be arranged in abutment with the SOA part 403 and a configuration may be employed in which the SOA part 403 and the light detector part 404 are connected by a waveguide 406.

The light detector part 404 changes part of an output light beam from the SOA part 403 into an electric current and detects light, while guiding the remaining part of the output light beam to a waveguide. With the light detector part 404 disposed forward of the SOA part 403, it is possible to feed back the output result from the SOA part 403. Hence, good APC is possible.

Here, a light detection layer 513 of the light detector part 404 may have the same layer structure as an active layer 504 and a guide layer 505 of a DFB laser 401 or an active layer 904 and a guide layer 905 of the SOA part 403 (referred to as the active layer structure). Alternatively, the light detection layer 513 of the light detector part 404 may instead have the same layer structure as an absorption layer 508 of an EA modulator part 402 (referred to as the EA structure), or the same structure as a core layer 510 of the waveguide(s) (referred to as the waveguide structure).

The light detector part 404 in this embodiment may obtain an electric current of about 30 mA with the active layer structure, of about 10 mA with the EA structure, and of about 1 mA with the waveguide structure from a typical light intensity (e.g., 0 dBm). In other words, the light detection sensitivity becomes smaller in the order of the active layer structure, the EA structure, and the waveguide structure. On the other hand, increase in detected optical current is equivalent to increase in optical loss. Then, if the intensity of the light beam to be finally input into the optical fiber 321 is desired to be strong, the waveguide structure, the EA structure, and the active layer structure are superior in this order. Hence, it is usually desirable to use the waveguide structure for the light detector part 404.

Also, an upper cladding layer 514 of the light detector part may have the same composition as a p-InP cladding layer 506 or the same composition as a non-doped InP layer 511. The light detection sensitivity of a p-InP layer is higher than that of a non-doped InP layer. However, for the intensity of the light beam to be input into the optical fiber, a non-doped InP layer is preferred over a p-InP layer.

Note that in the single SOA integrated EA-DFB laser in this embodiment, a waveguide 405 may be provided on the output end side of the light detector part 404, as illustrated in FIGS. 7A and 7B. Alternatively, a spot size conversion part that widens the spot size of the output light beam may be provided on the output end side.

Figure 9:
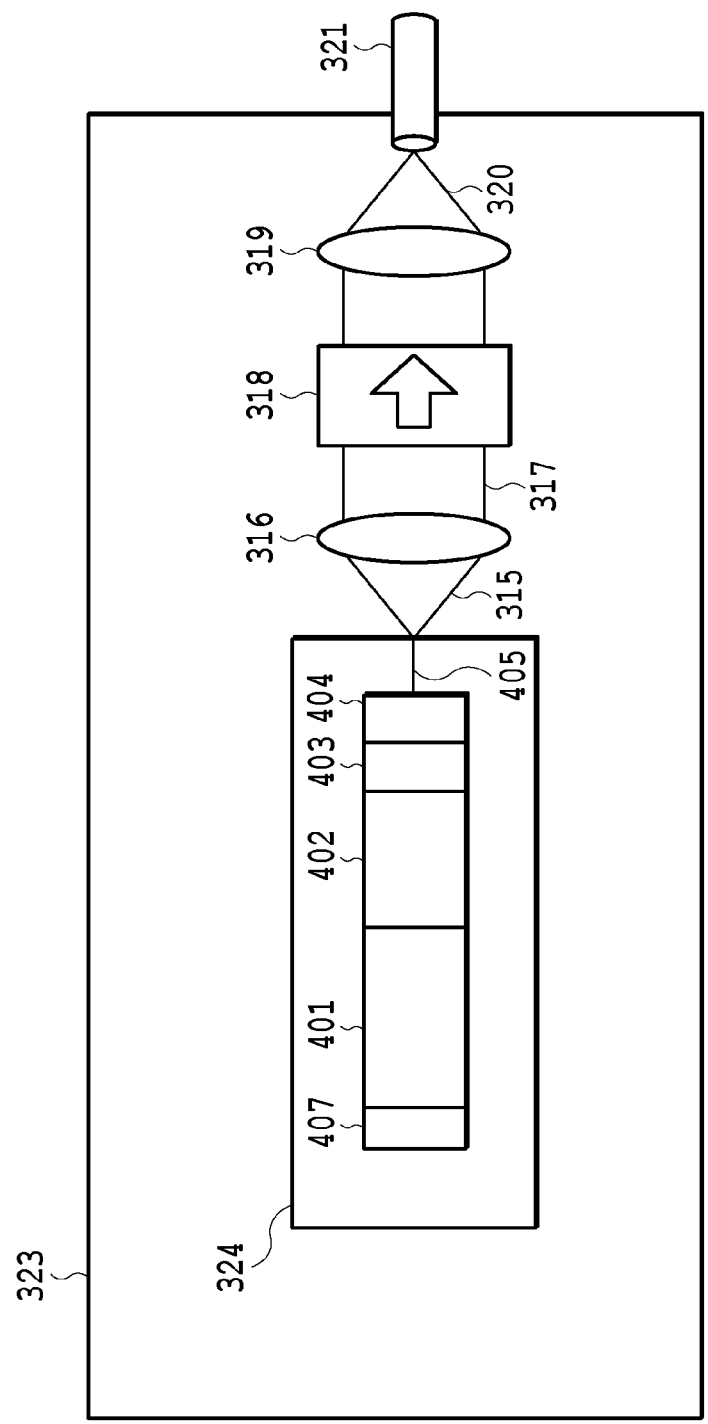
FIG. 9 is a diagram illustrating a configuration of an optical transmitter according to embodiment 2 of the present invention.
Figure 10:
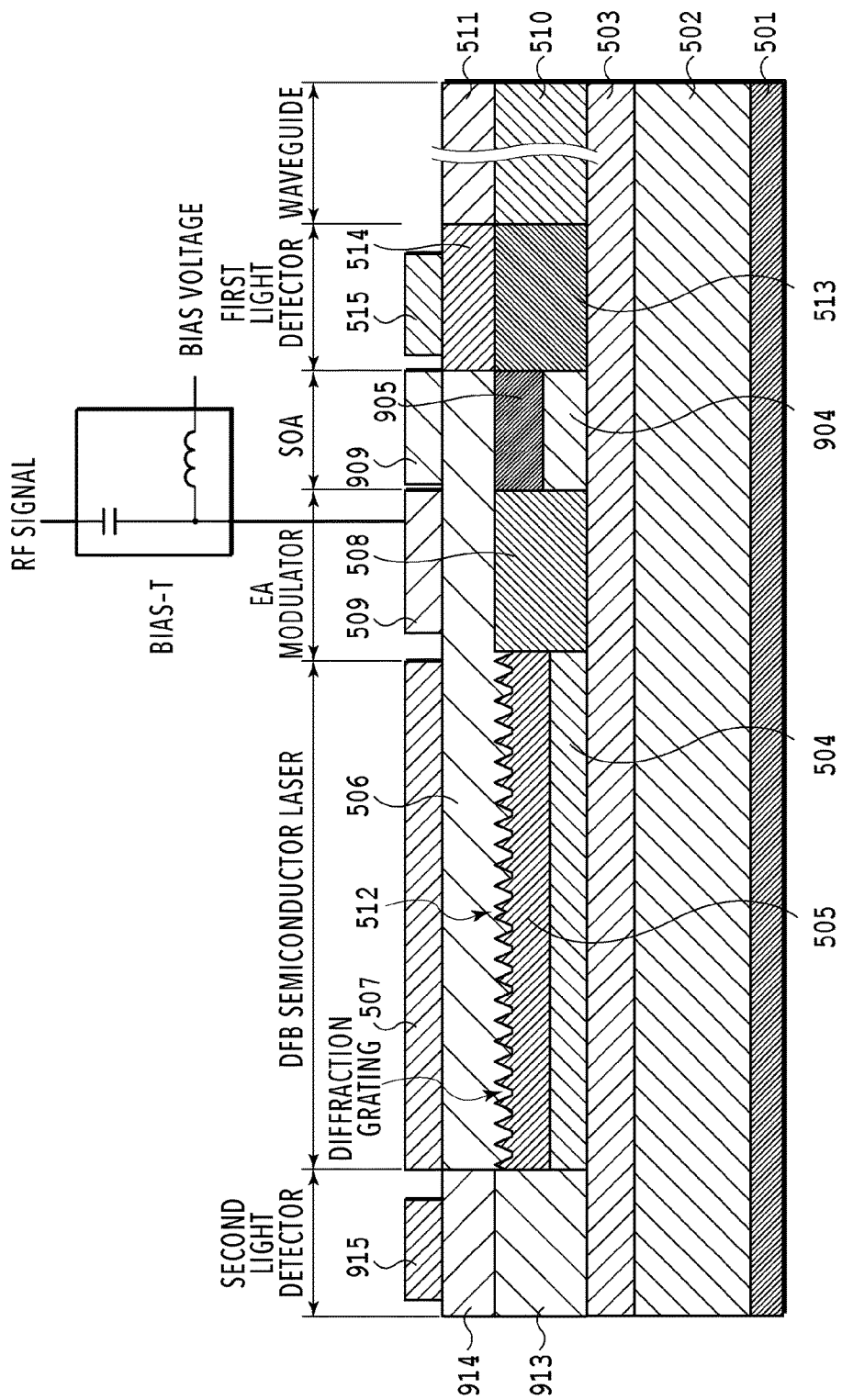
FIG. 10 is a cross-sectional view of a semiconductor chip with the optical transmitter according to embodiment 2 of the present invention.

(Embodiment 2) FIGS. 9 and 10 illustrate a configuration of an optical transmitter according to embodiment 2 of the present invention. This embodiment is a single SOA integrated EA-DFB laser obtained by disposing a second light detector part 407 rearward of the DFB laser 401 of the optical transmitter in embodiment 1. FIG. 10 is a cross-sectional view of the semiconductor chip 324 in FIG. 9.

With the second light detector part 407 placed rearward of the DFB semiconductor laser 401, the intensity of the output light beam from the DFB semiconductor laser 401 may be monitored without lowering the intensity of the light beam to be input into the optical fiber 321. On the other hand, the first light detector part 404, which is also disposed in embodiment 1, monitors the intensity of the output light beam from the entire body. Thus, if the light intensity detected by the first light detector part 404 drops, it is possible to determine whether it is caused by the DFB laser part 401 or the SOA part 403 or by both, by comparing the light intensities detected by both light detector parts.

Note that a light detection layer 913 and an upper cladding layer 914 of the second light detector part 407 may have the same compositions as or different compositions from the light detection layer 513 and the upper cladding layer 514 of the first light detector part 404. In view of, for example, ease in fabrication, the upper cladding layer 914 of the second light detector part 407 is desirably the same p-InP cladding layer as the layer 506, and the upper cladding layer 514 of the first light detector part 404 desirably has the same composition as the non-doped InP layer 511. In other words, the light detection layer 913 of the second light detector part 407 desirably has the active layer structure, which is the same layer structure as the active layer 504 and the guide layer 505 of the DFB laser 401 or the active layer 904 and the guide layer 905 of the SOA part 403.

Figure 11:
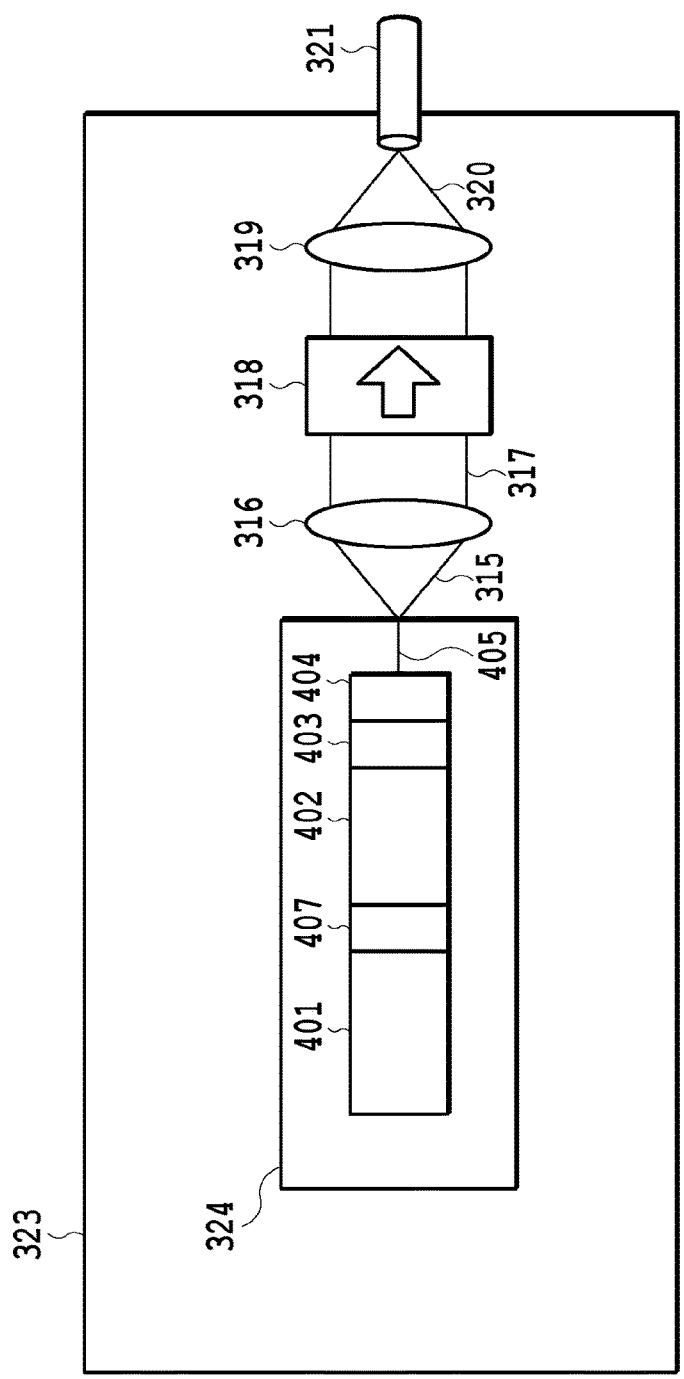
FIG. 11 is a diagram illustrating a configuration of an optical transmitter according to embodiment 3 of the present invention.
Figure 12:
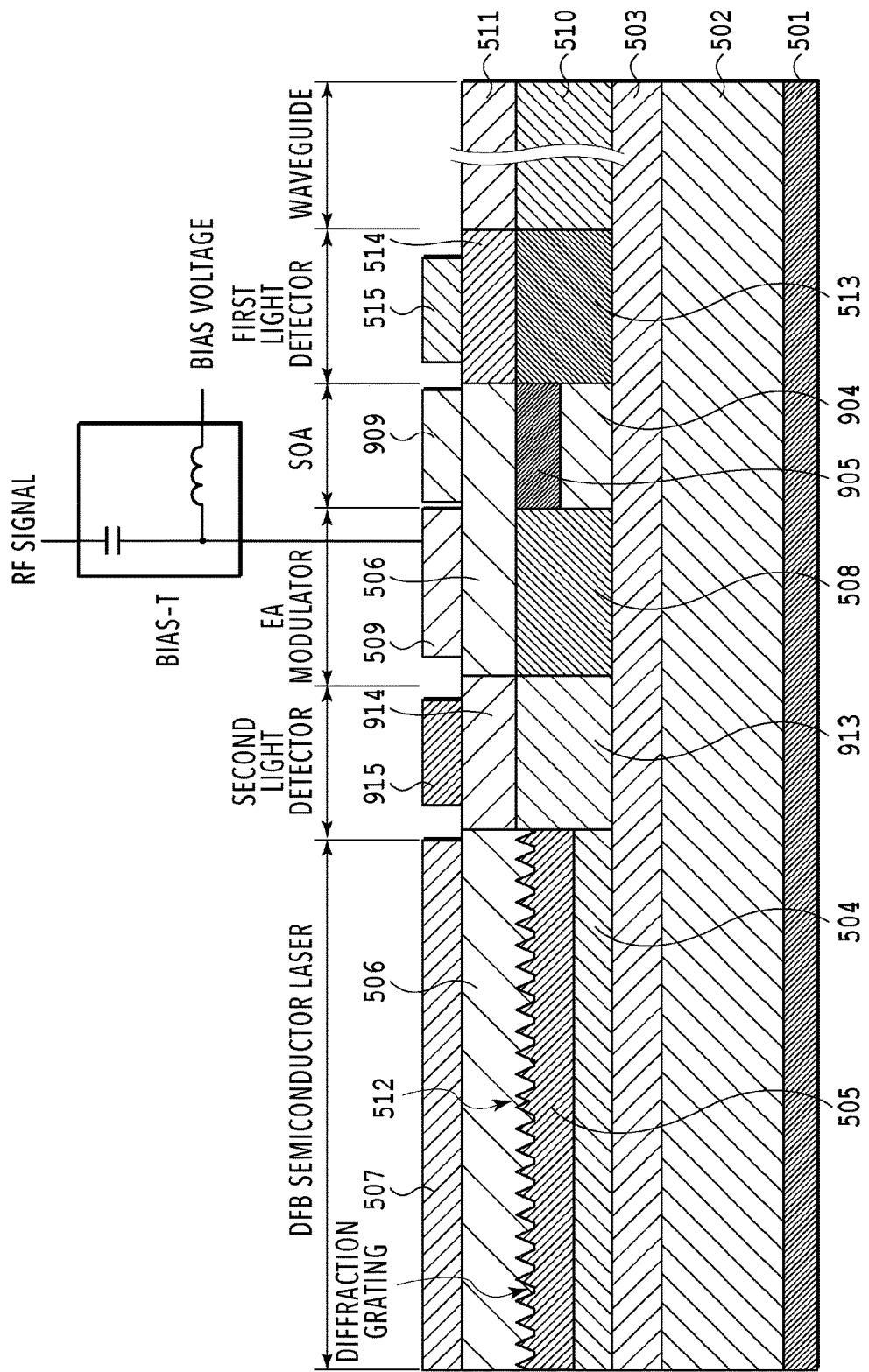
FIG. 12 is a cross-sectional view of a semiconductor chip with the optical transmitter according to embodiment 3 of the present invention illustrated in FIG. 11.
Figure 13:
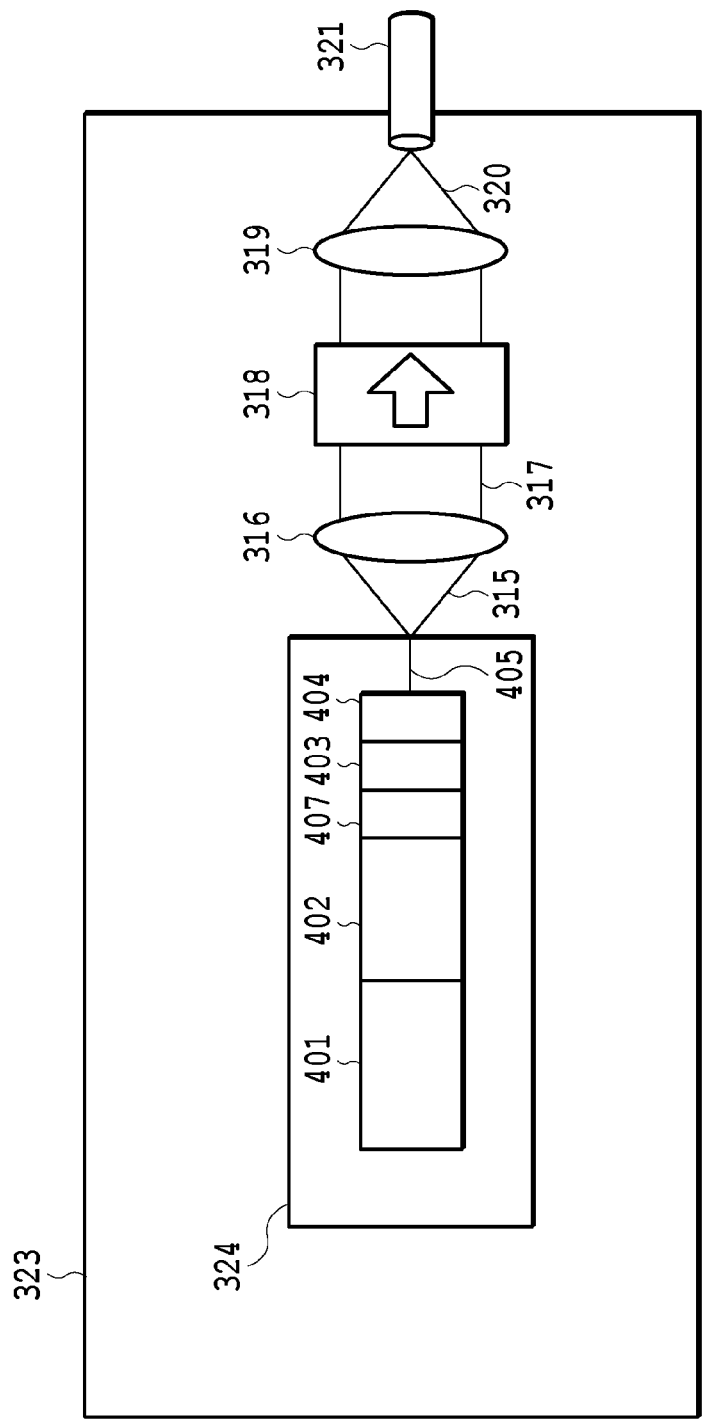
FIG. 13 is a diagram illustrating another configuration of the optical transmitter according to embodiment 3 of the present invention.
Figure 14:
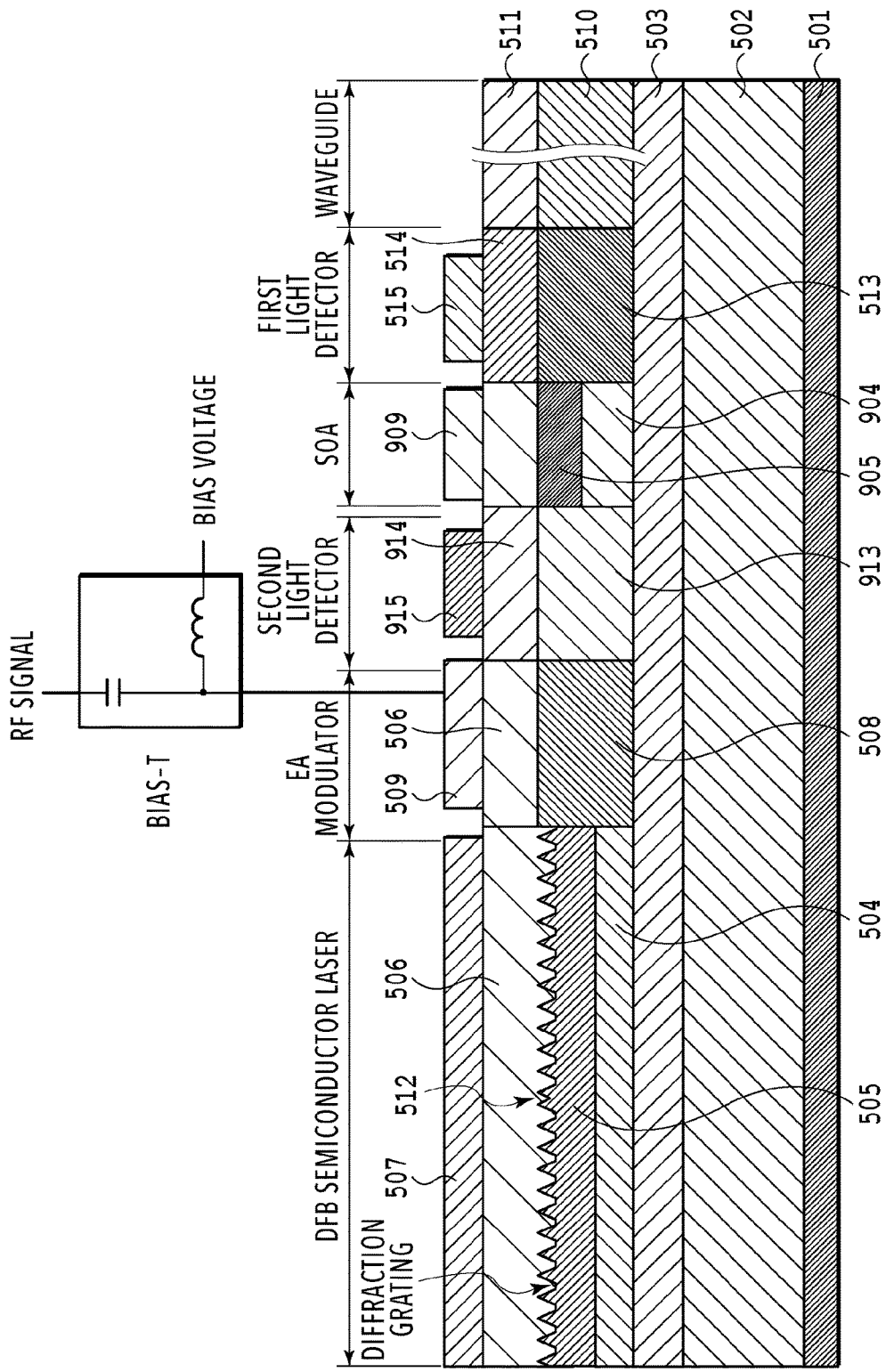
FIG. 14 is a cross-sectional view of a semiconductor chip with the optical transmitter according to embodiment 3 of the present invention illustrated in FIG. 13.

(Embodiment 3) FIGS. 11 to 14 illustrates configurations of an optical transmitter according to embodiment 3 of the present invention. The configuration in FIG. 11 is a single SOA integrated EA-DFB laser obtained by disposing a second light detector part 407 between the DFB semiconductor laser 401 and the EA modulator part 402 of the optical transmitter in embodiment 1. The configuration in FIG. 13 is a single SOA integrated EA-DFB laser obtained by disposing a second light detector part 407 between the EA modulator part 402 and the SOA part 403 of the optical transmitter in embodiment 1. FIGS. 12 and 14 are cross-sectional views of the semiconductor chips 324 in FIGS. 11 and 13, respectively.

With the second light detector part 407 placed between the DFB semiconductor laser 401 and the SOA part 403, the intensity of the output light beam from the DFB semiconductor laser 401 may be monitored. The first light detector part 404 monitors the intensity of the output light beam from the entire body. Thus, as in embodiment 2, if the light intensity detected by the first light detector part 404 drops, it is possible to determine whether it is caused by the DFB laser part 401 or the SOA part 403 or by both, by comparing the light intensities detected by both light detector parts. However, on condition that the second light detector part 407 is disposed and the same drive current is applied to the DFB laser 401, the intensity of the light beam to be input into the optical fiber 321 is strongest in the configuration of embodiment 2, illustrated in FIG. 9.

Note that a light detection layer 913 and an upper cladding layer 914 of the second light detector part 407 may have the same compositions as or different compositions from the light detection layer 513 and the upper cladding layer 514 of the first light detector part 404. In view of, for example, ease in fabrication, the upper cladding layer 914 of the second light detector part 407 is desirably the same p-InP cladding layer as the layer 506, and the upper cladding layer 514 of the first light detector part 404 desirably has the same composition as the non-doped InP layer 511. In other words, the light detection layer 913 of the second light detector part 407 desirably has the waveguide structure, which is the same structure as the core layer 510 of the waveguide.

Figure 1:
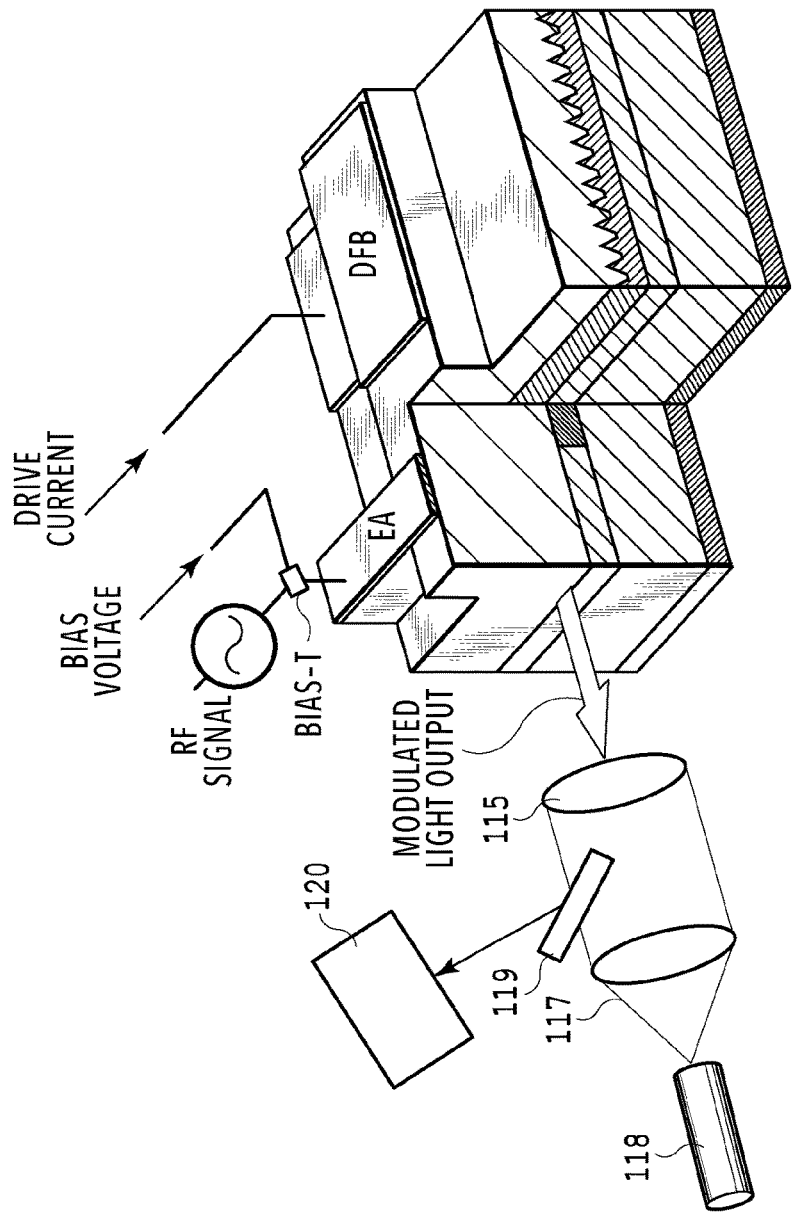
FIG. 1 is a view illustrating a conventional light intensity monitoring method for performing APC.
Figure 2:
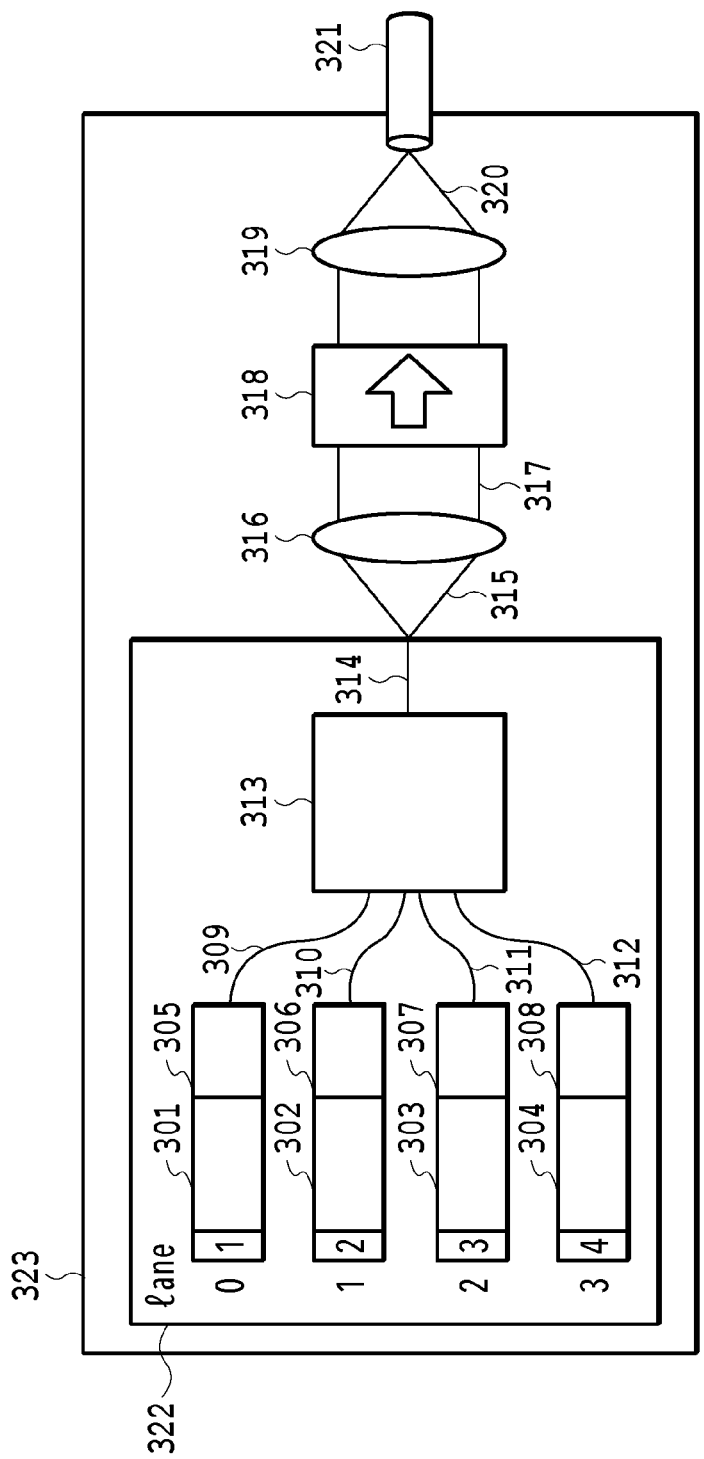
FIG. 2 is a diagram illustrating the configuration of a conventional wavelength multiplexing optical transmitter module used in 100 GbE.
Figure 3:
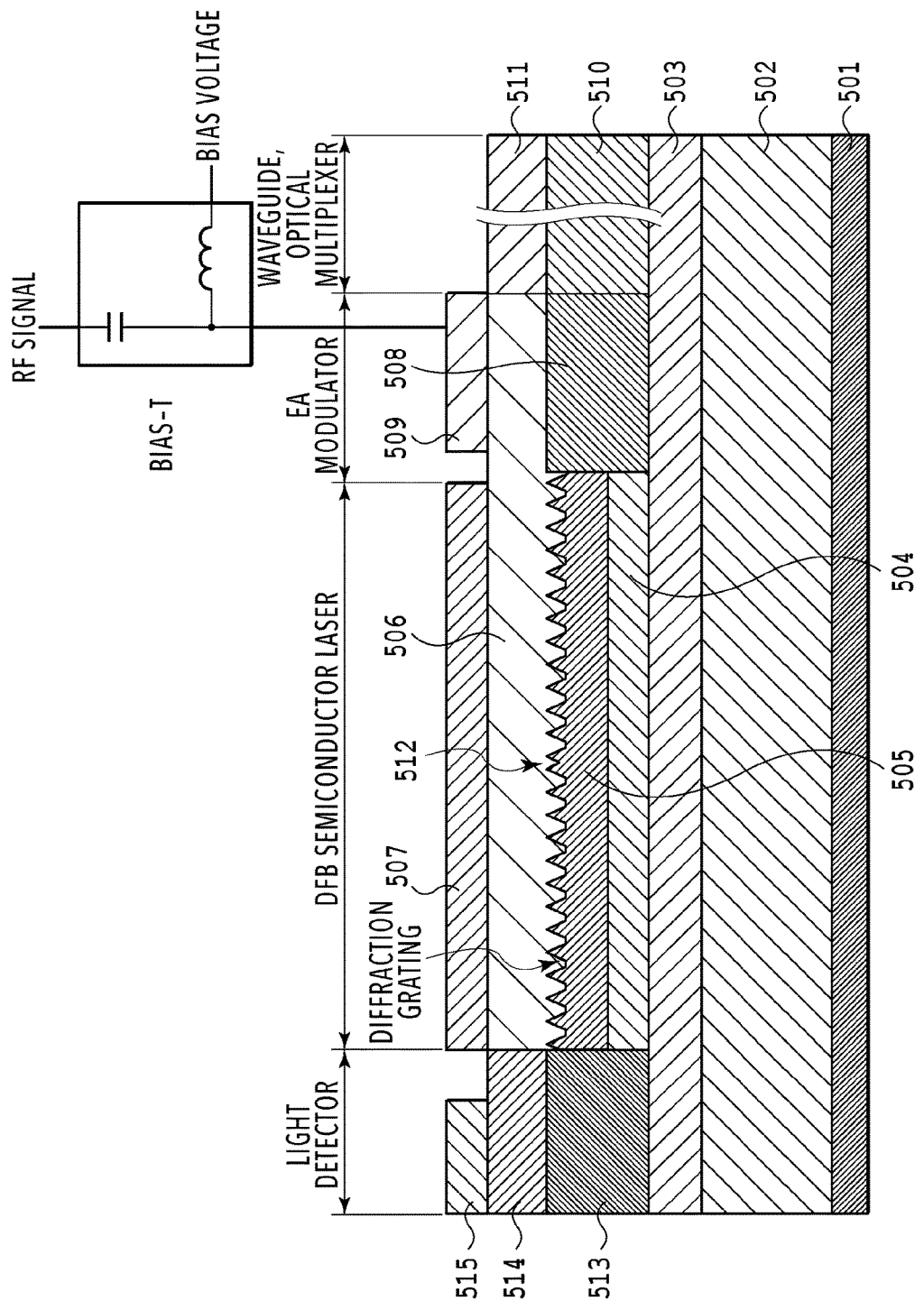
FIG. 3 is a cross-sectional view of a conventional semiconductor chip in which DFB laser parts, EA modulator parts, and optical multiplexer parts are formed.
Figure 4:
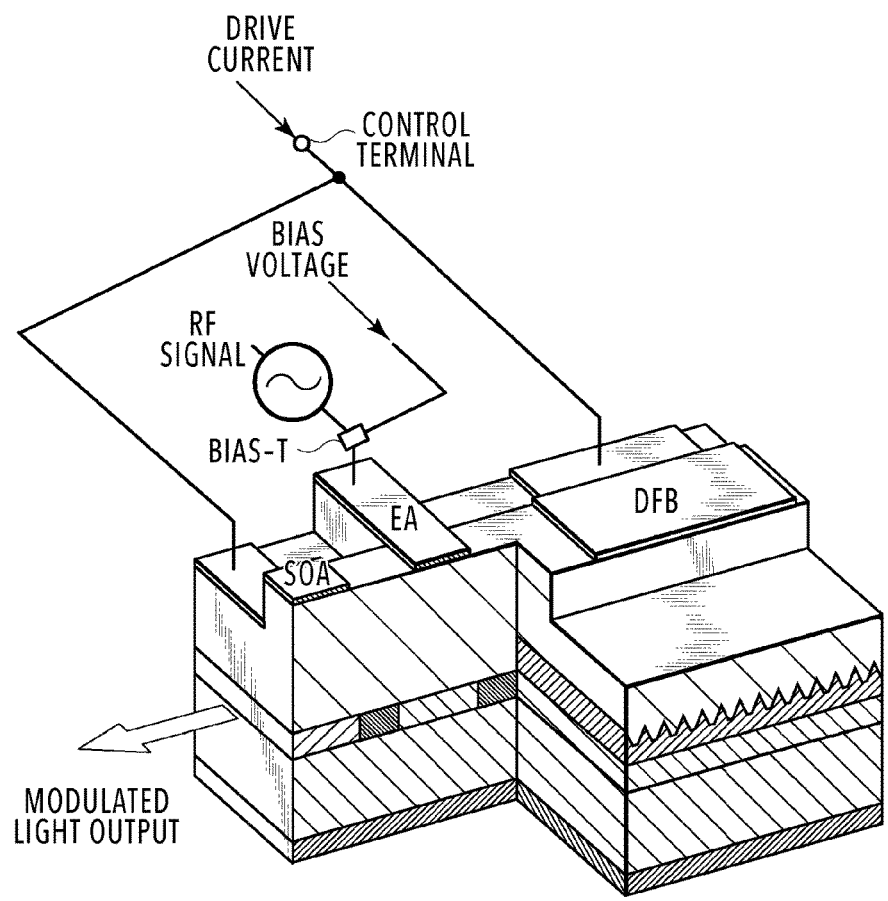
FIG. 4 is a view illustrating the structure of a semiconductor chip with conventional SOA integrated EA-DFB lasers.
Figure 5:
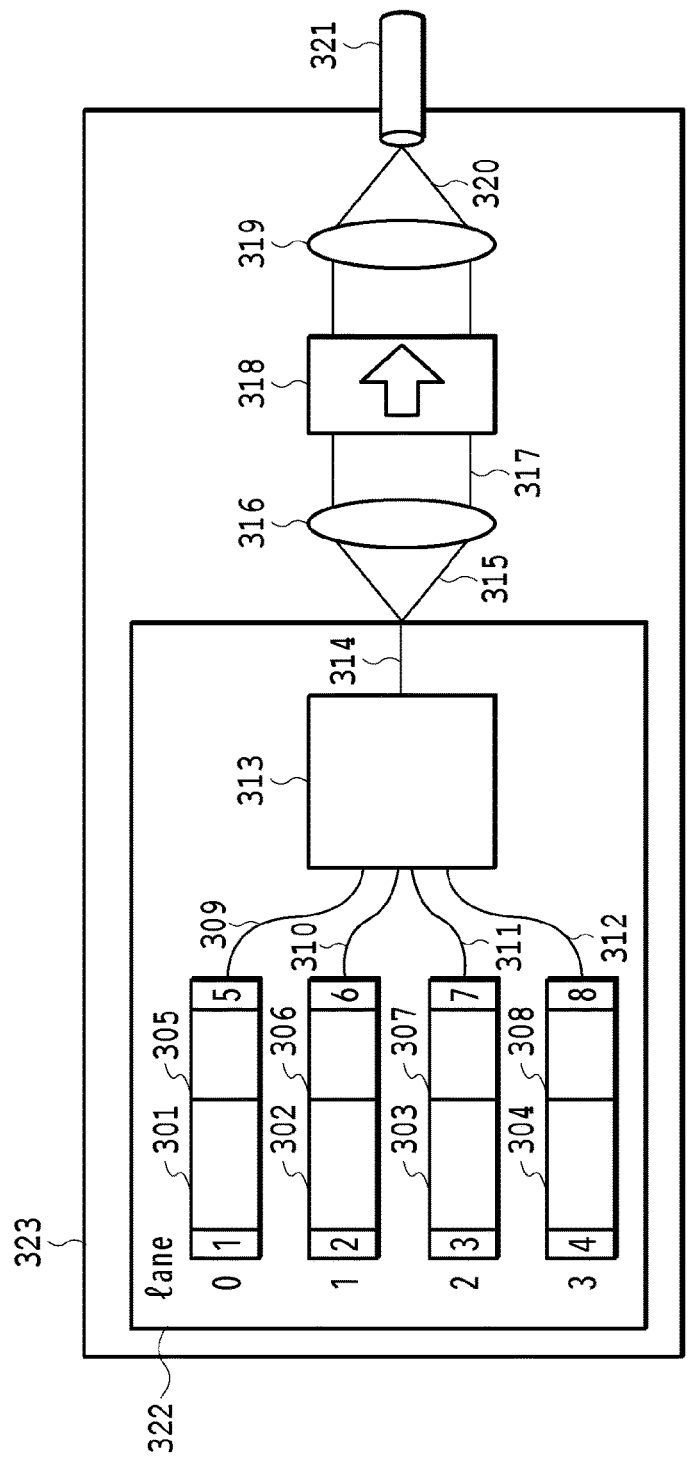
FIG. 5 is a diagram illustrating a configuration obtained by using the SOA integrated EA-DFB lasers in the configuration in FIG. 2.
Figure 6:
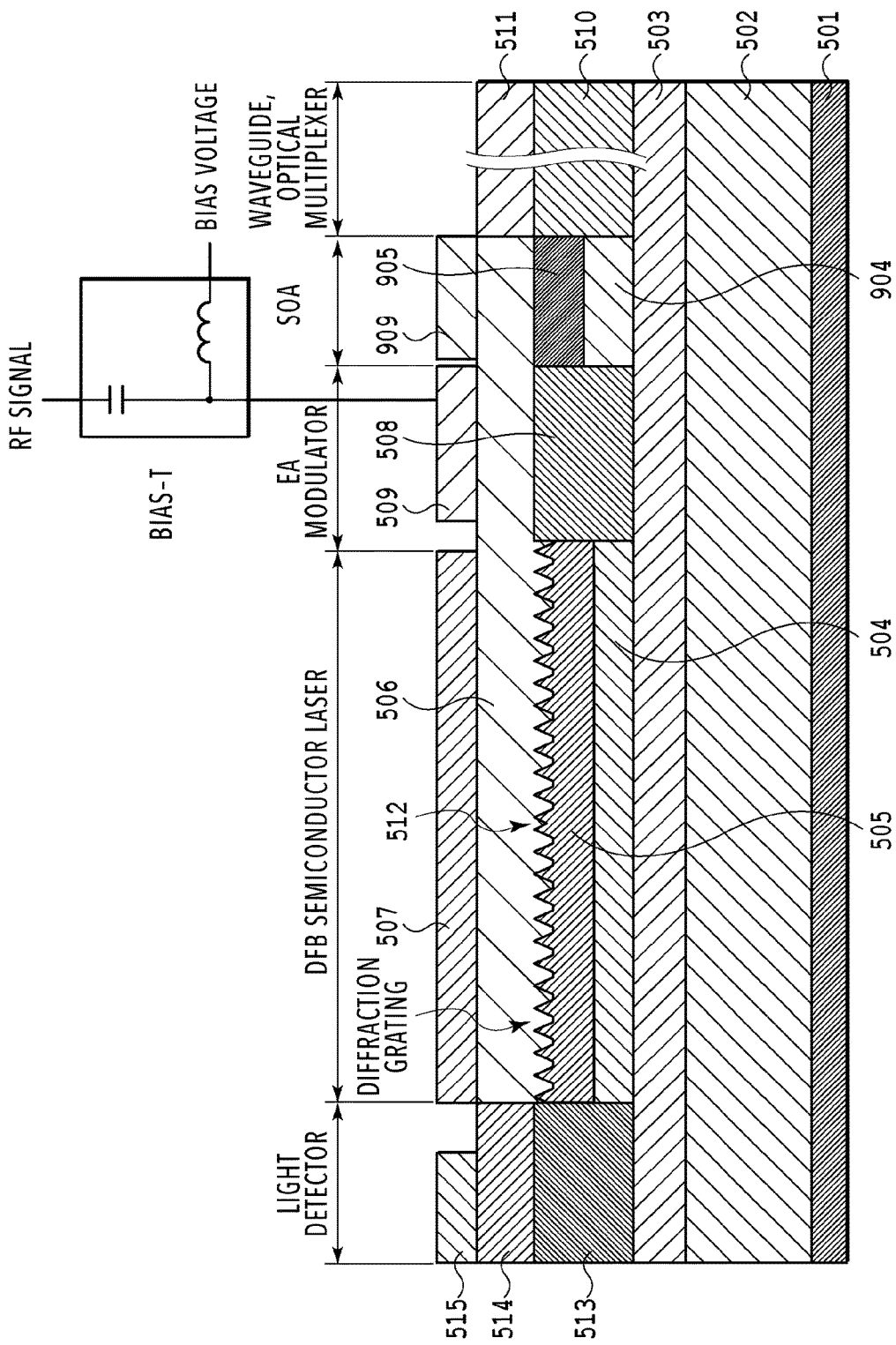
FIG. 6 is a cross-sectional view of a semiconductor chip with the conventional SOA integrated EA-DFB lasers.
Figure 15A:
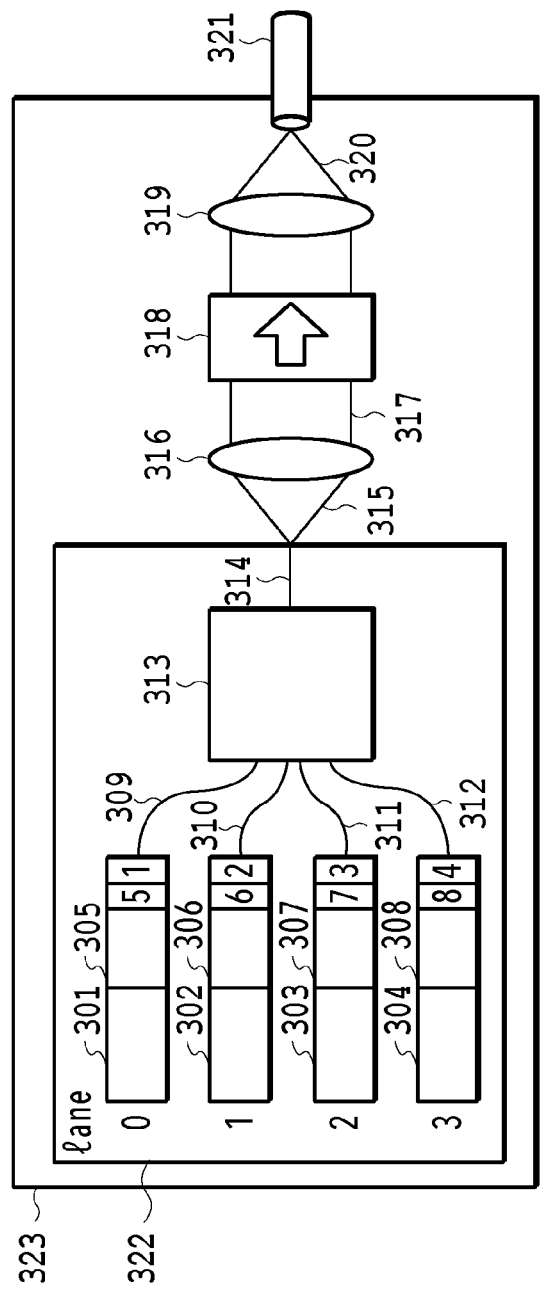
FIG. 15A is a diagram illustrating a configuration of a wavelength multiplexing optical transmitter according to embodiment 4 of the present invention.
Figure 15B:
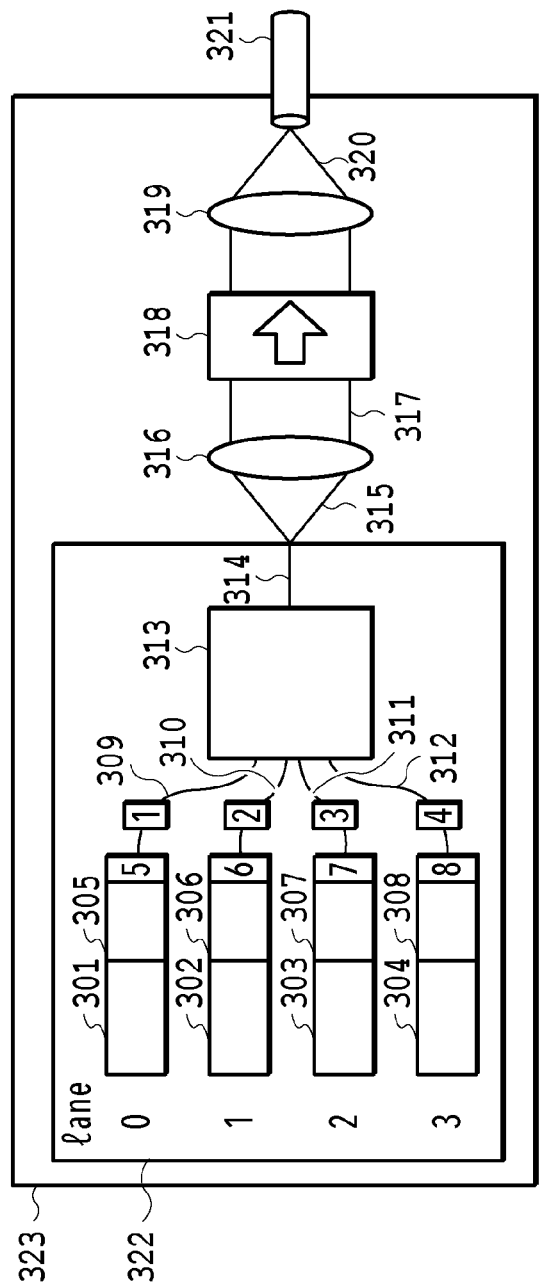
FIG. 15B is a diagram illustrating another configuration of the wavelength multiplexing optical transmitter according to embodiment 4 of the present invention.

(Embodiment 4) FIGS. 15A and 15B illustrate configurations of a wavelength multiplexing optical transmitter according to embodiment 4 of the present invention. Embodiment 4 is a configuration in which four of the SOA integrated EA-DFB lasers in embodiment 1 are integrated into an array, and modulated signal light beams output from the four SOA integrated EA-DFB lasers are multiplexed at an MMI optical multiplexer 313 and output as a single bundle of wavelength-multiplexed light beams into an output waveguide 314. In other words, embodiment 4 is a structure obtained by disposing the light detector parts 1 to 4 in FIG. 5 forward of the output end sides of the SOA parts 5 to 8, respectively. The structures of each lane in FIGS. 15A and 15B are the same as those illustrated in FIGS. 8A and 8B, respectively.

The light detector parts 1 to 4 change part of output light beams from the SOA parts 5 to 8 into electric currents and detect light, while guiding the remaining part of the output light beams to respective waveguides. With the light detector parts 1 to 4 disposed forward of the SOA parts 5 to 8, it is possible to feed back the output results from the SOA parts 5 to 8. Hence, good APC is possible.

Here, the light detection layers 513 of the light detector parts 1 to 4 can have the same layer structure as the active layers 504 and the guide layers 505 of the DFB lasers or the active layers 904 and the guide layers 905 of the SOA parts 5 to 8 (referred to as the active layer structure). Alternatively, the light detection layers 513 of the light detector parts 1 to 4 can instead have the same layer structure as the absorption layers 508 of the EA modulator parts 305 to 308 (referred to as the EA structure), or the same structure as the core layers 510 of the waveguides 309 to 312 and 314 and the optical multiplexer 313 (referred to as the waveguide structure).

The light detector parts 1 to 4 in this embodiment can obtain an electric current of about 30 mA with the active layer structure, of about 10 mA with the EA structure, and of about 1 mA with the waveguide structure from a typical light intensity (e.g., 0 dBm). In other words, the light detection sensitivity becomes smaller in the order of the active layer structure, the EA structure, and the waveguide structure. On the other hand, increase in detected optical current is equivalent to increase in optical loss. Then, if the intensity of the light beam to be finally input into the optical fiber 321 is desired to be strong, the waveguide structure, the EA structure, and the active layer structure are superior in this order. Hence, it is usually desirable to use the waveguide structure for the light detector parts 1 to 4.

Also, the upper cladding layers 514 of the light detector parts may have the same composition as the p-InP cladding layers 506 or the same composition as the non-doped InP layers 511. The light detection sensitivity of a p-InP layer is higher than that of a non-doped InP layer. However, for the intensity of the light beam to be input into the optical fiber, a non-doped InP layer is preferred over a p-InP layer.

Figure 16:
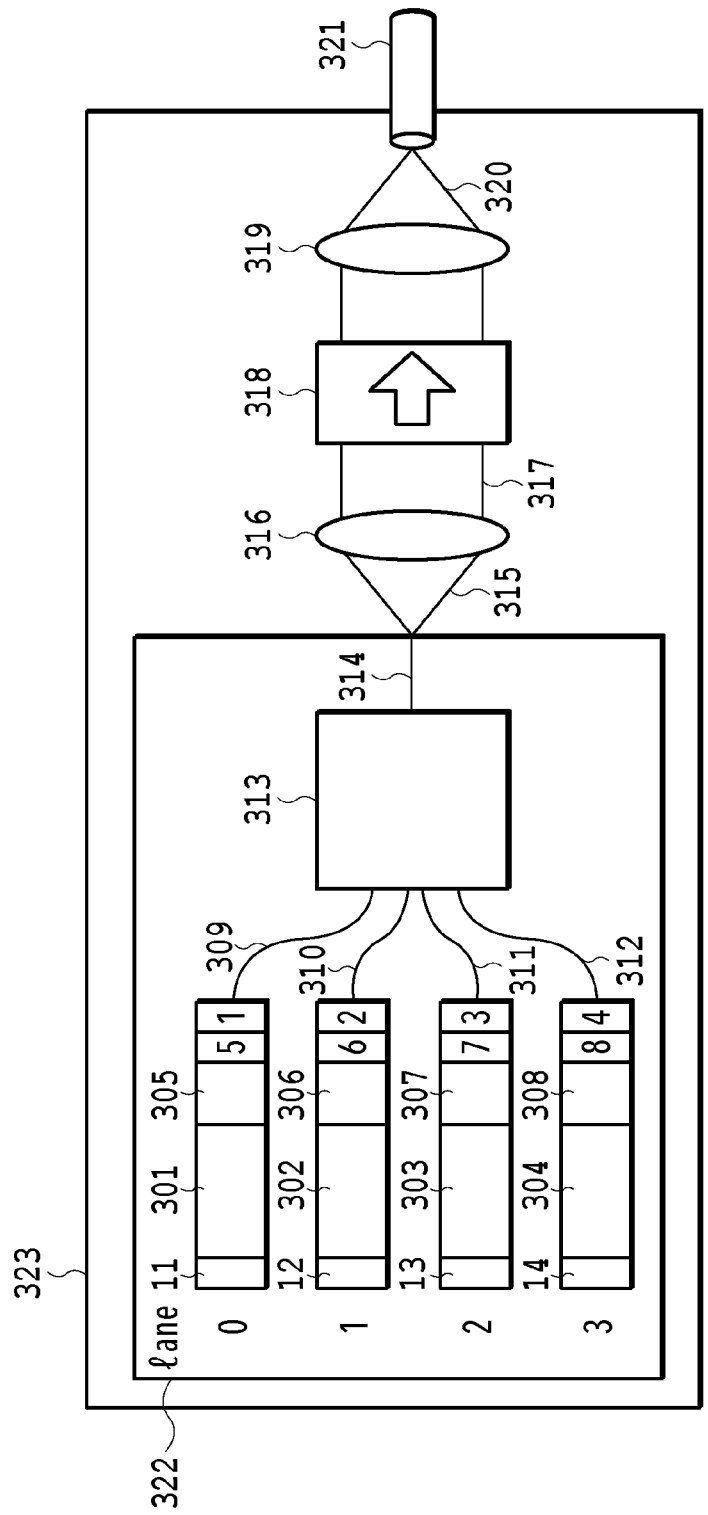
FIG. 16 is a diagram illustrating a configuration of a wavelength multiplexing optical transmitter according to embodiment 5 of the present invention.

(Embodiment 5) FIG. 16 illustrates a configuration of a wavelength multiplexing optical transmitter according to embodiment 5 of the present invention. It is a wavelength multiplexing optical transmitter obtained by positioning second light detector parts 11 to 14 rearward of the DFB lasers 301 to 304 of the wavelength multiplexing optical transmitter in embodiment 4. The structure of each lane in FIG. 16 is the same as that illustrated in FIG. 10.

With the second light detector parts 11 to 14 placed rearward of the DFB semiconductor lasers 301 to 304, the intensities of the output light beams from the DFB semiconductor lasers 301 to 304 may be monitored without lowering the intensity of the light beam to be input into the optical fiber 321. On the other hand, the first light detector parts 1 to 4, which are also disposed in embodiment 4, monitor the intensities of the output light beams from the entire bodies. Thus, if any of the light intensities detected by the first light detector parts 1 to 4 drops, it is possible to determine whether it is caused by the corresponding one of the DFB laser parts 301 to 304 or the corresponding one of the SOA parts 5 to 8 or by both, by comparing the light intensities detected by both light detector parts.

Note that the light detection layers 913 and the upper cladding layers 914 of the second light detector parts 11 to 14 may have the same compositions as or different compositions from the light detection layers 513 and the upper cladding layers 514 of the first light detector parts 1 to 4. In view of, for example, ease in fabrication, the upper cladding layers 914 of the second light detector parts 11 to 14 are desirably the same p-InP cladding layers as the layers 506, and the upper cladding layers 514 of the first light detector parts 1 to 4 desirably have the same compositions as the non-doped InP layers 511. In other words, the light detection layers 913 of the second light detector parts 11 to 14 desirably have the active layer structure, which is the same layer structure as the active layers 504 and the guide layers 505 of the DFB lasers 301 to 304 or the active layers 904 and the guide layers 905 of the SOA parts 5 to 8.

Figure 17:
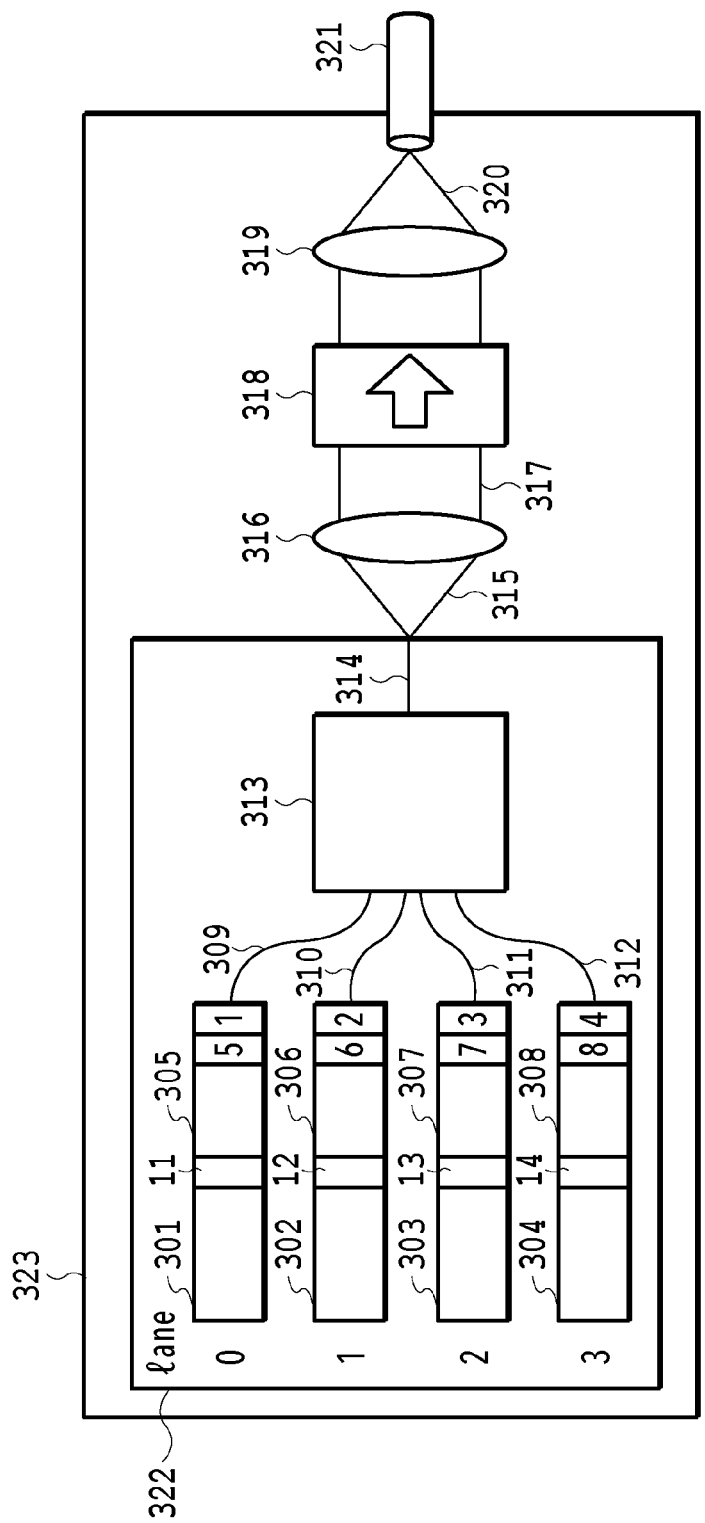
FIG. 17 is a diagram illustrating a configuration of a wavelength multiplexing optical transmitter according to embodiment 6 of the present invention.
Figure 18:
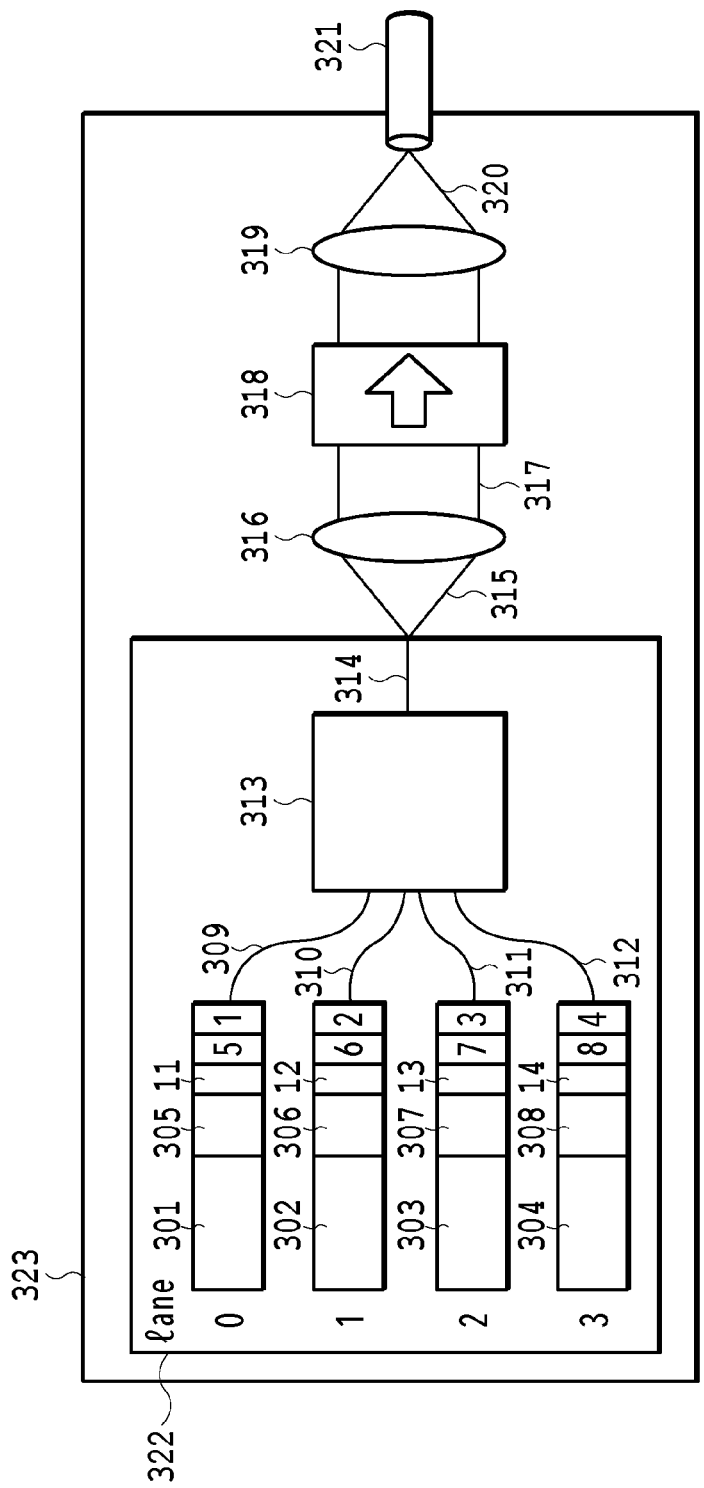
FIG. 18 is a diagram illustrating another configuration of the wavelength multiplexing optical transmitter according to embodiment 6 of the present invention.

(Embodiment 6) FIGS. 17 and 18 illustrates configurations of a wavelength multiplexing optical transmitter according to embodiment 6 of the present invention. The configurations in FIGS. 17 and 18 are structures obtained by disposing second light detector parts 11 to 14 between the DFB semiconductor lasers 301 to 304 and the SOA parts 5 to 8 of the wavelength multiplexing optical transmitter in embodiment 4, respectively. The structures of each lane in FIGS. 17 and 18 are the same as those illustrated in FIGS. 12 and 14, respectively.

With the second light detector parts 11 to 14 placed between the DFB semiconductor lasers 301 to 304 and the SOA parts 5 to 8, the intensities of the output light beams from the DFB semiconductor lasers 301 to 304 can be monitored without lowering the intensity of the light beam to be input into the optical fiber 321. On the other hand, the first light detector parts 1 to 4, which are also disposed in embodiment 4, monitor the intensities of the output light beams from the entire bodies. Thus, if any of the light intensities detected by the first light detector parts 1 to 4 drops, it is possible to determine whether it is caused by the corresponding one of the DFB laser parts 301 to 304 or the corresponding one of the SOA parts 5 to 8 or by both, by comparing the light intensities detected by both light detector parts.

Note that the light detection layers 913 and the upper cladding layers 914 of the second light detector parts 11 to 14 may have the same compositions as or different compositions from the light detection layers 513 and the upper cladding layers 514 of the first light detector parts 1 to 4. In view of, for example, ease in fabrication, the upper cladding layers 914 of the second light detector parts 11 to 14 are desirably the same p-InP cladding layers as the layers 506, and the upper cladding layers 514 of the first light detector parts 1 to 4 desirably have the same compositions as the non-doped InP layers 511. In other words, the light detection layers 913 of the second light detector parts 11 to 14 desirably have the waveguide structure, which is the same structure as the core layers 510 of the waveguides.

(Other Embodiments) Meanwhile, the present invention has been described through examples with four (SOA integrated) EA-DFBs and an MMI 4×1 optical multiplexer as the optical multiplexer. However, the number of (SOA integrated) EA-DFBs and the number of branches in the multiplexer are not limited to the above. Specifically, the number of (SOA integrated) EA-DFBs may be, for example, 2, 8, 16, or more, and the optical multiplexer may be a 2×1, 8×1, or 16×1 optical multiplexer. Also, the optical multiplexer is not limited to an MMI type but can be a directional coupler type, a Y-branch type, a Mach-Zehnder type, a dielectric multi-layer filter type, an arrayed waveguide grating type, or a combination of these.

Typically, the wavelengths at the lanes are in the following ranges.
Lane 0: 1294.53 to 1296.59 nm
Lane 1: 1299.02 to 1301.09 nm
Lane 2: 1303.54 to 1305.63 nm
Lane 3: 1308.09 to 1310.19 nm Also, the rate of the modulation by the EA modulator parts is 25 Gb/s or 28 Gb/s. However, the present invention is not limited to the above, because the number of lanes and the wavelength intervals change when the number of EA-DFBs changes.

Also, although the present invention is normally used for 25 Gb/s×4 wavelengths=100 Gb/s, it may be used for 50 Gb/s×8 wavelengths=400 Gb/s, 25 Gb/s×16 wavelengths=400 Gb/s, and 10 Gb/s×10 wavelengths=100 Gb/s, for example.

Further, the description has been given of the examples in which lanes 0 to 3 are arranged in ascending order of wavelength. However, the order of the lanes can be determined to be any order irrespective of their wavelengths and is not limited to the above-described order.

Also, the above description has been given assuming that the length of the DFB laser, the length of the EA modulator part, and the length of the SOA part are the same in each line. However, these lengths may differ from one lane to another.

Also, the above description has been given assuming that the compositions of the DFB laser, the EA modulator part, and the SOA part are the same in each lane. However, the compositions may differ from one lane to another.

Also, the above description has been given of the examples in which the DFB laser(s), the EA modulator part(s), the SOA part(s), the waveguide(s), and the optical multiplexer are all provided on the same semiconductor substrate. However, the present invention is not limited to these. For example, the DFB laser(s), the EA modulator part(s), and the SOA part(s) may be provided on the same semiconductor substrate, whereas the waveguide(s) may be provided by creating the optical multiplexer from silica-based waveguides, silicon waveguides, or the like on a silicon substrate. Further, the DFB laser(s), the EA modulator part(s), and the SOA part(s) may not be on the same semiconductor substrate but be on individual substrates, respectively. What is important in the present invention is to provide a light detector part on the output end side of at least one SOA part.

REFERENCE SIGNS LIST 1 to 4, 11 to 14 light detector part
5 to 8 SOA part
115, 117 lens
118 fiber
119 mirror
120 light detector
301 to 304 DFB laser
305 to 308 EA modulator part
309 to 312 input waveguide
313 optical multiplexer
314 output waveguide
315 scattered light beam
316, 319 lens
317 parallel light beam
318 isolator
320 converged light beam
321 fiber 322, 324 semiconductor chip
323 optical transmitter module
401 DFB laser
402 EA modulator part
403 SOA part
404, 407 light detector part
405, 406 waveguide
501 n electrode
502 n-InP substrate
503 n-InP cladding layer
504 active layer
505 guide layer
506 p-InP cladding layer
507, 509, 515 electrode
508 absorption layer
510 core layer
511 non-doped InP layer
513 light detection layer
514 upper cladding layer
904 active layer
905 guide layer
909 electrode
913 light detection layer
914 upper cladding layer
915 electrode

The invention claimed is:

1. An optical transmitter comprising:
an SOA integrated EA-DFB including a DFB laser, an EA modulator connected to the DFB laser, and an SOA connected to the EA modulator and a waveguide;
a first light detector for monitoring a signal light beam emitted from the SOA of the SOA integrated EA-DFB, wherein a light detection layer of the first light detector and an absorption layer of the EA modulator or a core layer of the waveguide have the same structure; and
a drive device connected to the DFB laser and the SOA by a single control terminal, for controlling a drive current in accordance with light intensity detected by the first light detector.

2. The optical transmitter according to claim 1, further comprising a second light detector for monitoring a light beam emitted from the DFB laser, the light beam being monitored without passing through the SOA.

3. The optical transmitter according to claim 2, wherein the second light detector is disposed to be connected to an end surface of the DFB laser opposite from an end surface thereof connected to the EA modulator.

4. The optical transmitter according to claim 2, wherein the second light detector is disposed between the DFB laser and the SOA of the SOA integrated EA-DFB.

5. An optical transmitter comprising:
a plurality of SOA integrated EA-DFBs, wherein each SOA integrated EA-DFB includes a DFB laser, an EA modulator connected to the DFB laser, an SOA connected to the EA modulator, a waveguide, and a first light detector for monitoring a signal light beam emitted from the SOA with different oscillation wavelengths of the respective DFB lasers, wherein a light detection layer of the first light detector and an absorption layer of the EA modulator or a core layer of the waveguide have the same structure;
an optical multiplexer for multiplexing a plurality of signal light beams emitted from the SOAs of the plurality of SOA integrated EA-DFBs to output a resultant wavelength-multiplexed light beam; and
a drive device connected to the DFB laser and the SOA of the each SOA integrated EA-DFB by a single control terminal, for controlling a drive current in accordance with light intensity detected by the first light detector respectively.

6. The optical transmitter according to claim 5, wherein the each SOA integrated EA-DFB includes a second light detector for monitoring a light beam emitted from the DFB laser, the light beam being monitored without passing through the SOA.

7. The optical transmitter according to claim 6, wherein the second light detector is disposed to be connected to an end surface of the DFB laser opposite from an end surface thereof connected to the EA modulator.

8. The optical transmitter according to claim 6, wherein the second light detector is disposed between the DFB laser and the SOA of the SOA integrated EA-DFB.

9. An optical transmitter comprising:
an SOA integrated EA-DFB including a DFB laser, an EA modulator connected to the DFB laser and having a lower cladding layer, an absorption layer and an upper cladding layer, an SOA connected to the EA modulator, and a waveguide having a lower cladding layer, a core layer, and an upper cladding layer;
a first light detector having the same layer structure as the EA modulator or the waveguide for monitoring a signal light beam emitted from the SOA of the SOA integrated EA-DFB, wherein a light detection layer of the first light detector is identical to the absorption layer of the EA modulator or a the core layer of the waveguide; and
a drive device connected to the DFB laser and the SOA by a single control terminal, for controlling a drive current in accordance with light intensity detected by the first light detector.

* * * * *